United States Patent
Takahashi et al.

(10) Patent No.: US 9,279,079 B2
(45) Date of Patent: *Mar. 8, 2016

(54) METHOD OF MANUFACTURING PHOSPHOR, LIGHT-EMITTING DEVICE, AND IMAGE DISPLAY APPARATUS

(75) Inventors: Kohsei Takahashi, Kobe (JP); Masamichi Harada, Nara (JP); Naoto Hirosaki, Tsukuba (JP)

(73) Assignees: SHARP KABUSHIKI KAISHA, Osaka (JP); NATIONAL INSTITUTE FOR MATERIALS SCIENCE, Ibaraki (JP)

(*) Notice: Subject to any disclaimer, the term of this patent is extended or adjusted under 35 U.S.C. 154(b) by 724 days.

This patent is subject to a terminal disclaimer.

(21) Appl. No.: 12/155,073

(22) Filed: May 29, 2008

(65) Prior Publication Data

US 2008/0297031 A1 Dec. 4, 2008

(30) Foreign Application Priority Data

May 30, 2007 (JP) ................................. 2007-143745
Dec. 10, 2007 (JP) ................................. 2007-318468

(51) Int. Cl.
C09K 11/77 (2006.01)
H01L 33/50 (2010.01)
C09K 11/08 (2006.01)

(52) U.S. Cl.
CPC .......... *C09K 11/7734* (2013.01); *C09K 11/0883* (2013.01)

(58) Field of Classification Search
CPC ............ C09K 11/025; C09K 11/0883; C09K 11/0838; C09K 11/77; C09K 11/7706; C09K 11/7715; C09K 11/7721; C09K 11/7728; C09K 11/7734; C09K 11/7774; C09K 11/7783; H01L 33/502; H05B 33/14
USPC ............. 252/301.4 F, 301.4 R; 313/467, 468, 313/503; 428/690
See application file for complete search history.

(56) References Cited

U.S. PATENT DOCUMENTS

| 4,851,205 A | 7/1989 | Mitomo |
| 5,200,374 A | 4/1993 | Yamada et al. |

(Continued)

FOREIGN PATENT DOCUMENTS

| CN | 1195817 A | 10/1998 |
| CN | 1563273 A | 1/2005 |

(Continued)

OTHER PUBLICATIONS http://www.merriam-webster.com/dictionary/vicinity, p. 1, printed Nov. 20, 2014.*

(Continued)

*Primary Examiner* — Matthew E Hoban
*Assistant Examiner* — Lynne Edmondson
(74) *Attorney, Agent, or Firm* — Birch, Stewart, Kolasch & Birch, LLP

(57) ABSTRACT

A method of manufacturing a first phosphor of which emission spectrum shape well matches with a color filter of three primary colors of light, a light-emitting device including the first phosphor, and an image display apparatus including the light-emitting device are provided. The light-emitting device includes a semiconductor light-emitting element emitting excitation light and the first phosphor absorbing the excitation light and emitting green light. The first phosphor contains a solid solution of aluminum element and a metal element M selected from the group consisting of Mn, Ce and Eu in crystals of an oxynitride having a β-type $Si_3N_4$ crystal structure, an amount of oxygen in the crystals being not higher than 0.8 mass %.

4 Claims, 13 Drawing Sheets

(56) References Cited

U.S. PATENT DOCUMENTS

| | | | |
|---|---|---|---|
| 5,787,478 A | 7/1998 | Hicks et al. | |
| 7,253,446 B2* | 8/2007 | Sakuma et al. | 257/98 |
| 7,391,060 B2* | 6/2008 | Oshio | 257/98 |
| 7,544,310 B2* | 6/2009 | Hirosaki | C04B 35/584 252/301.4 F |
| 7,611,642 B2* | 11/2009 | Takahashi et al. | 252/301.4 F |
| 7,700,964 B2* | 4/2010 | Morimoto et al. | 257/98 |
| 7,815,817 B2* | 10/2010 | Hirosaki | 252/301.4 F |
| 7,846,351 B2* | 12/2010 | Hirosaki | 252/301.4 F |
| 8,147,715 B2* | 4/2012 | Hirosaki | C09K 11/0883 252/301.4 F |
| 8,765,015 B2* | 7/2014 | Hirosaki | C09K 11/0883 252/301.4 F |
| 2003/0020101 A1 | 1/2003 | Bonger et al. | |
| 2003/0024438 A1 | 2/2003 | Botty et al. | |
| 2005/0116619 A1 | 6/2005 | Kuma et al. | |
| 2005/0185112 A1 | 8/2005 | Hara | |
| 2006/0163605 A1* | 7/2006 | Miyahara | 257/103 |
| 2006/0208262 A1 | 9/2006 | Sakuma et al. | |
| 2006/0221637 A1 | 10/2006 | Chikugawa et al. | |
| 2007/0007494 A1 | 1/2007 | Hirosaki et al. | |
| 2007/0018567 A1 | 1/2007 | Hirosaki | |
| 2007/0040152 A1 | 2/2007 | Oshio | |
| 2007/0108896 A1 | 5/2007 | Hirosaki | |
| 2007/0164308 A1* | 7/2007 | Yoshimura et al. | 257/103 |
| 2007/0182887 A1 | 8/2007 | Haga et al. | |
| 2007/0259206 A1 | 11/2007 | Oshio | |
| 2008/0106186 A1* | 5/2008 | Ishii et al. | 313/503 |
| 2009/0026916 A1 | 1/2009 | Ishii et al. | |
| 2009/0057611 A1 | 3/2009 | Hirosaki | |
| 2009/0250663 A1 | 10/2009 | Oshio | |
| 2009/0272995 A1 | 11/2009 | Ito et al. | |

FOREIGN PATENT DOCUMENTS

| | | | |
|---|---|---|---|
| CN | 1613028 A | 5/2005 | |
| CN | 1881629 A | 12/2006 | |
| EP | 1964905 A1 | 9/2008 | |
| JP | 60-206889 A | 10/1985 | |
| JP | 62-167209 A | 7/1987 | |
| JP | 3-290373 A | 12/1991 | |
| JP | 6-9956 A | 1/1994 | |
| JP | 2002-363554 A | 12/2002 | |
| JP | 2003-515665 A | 5/2003 | |
| JP | 2005-112922 A | 4/2005 | |
| JP | 2005-255895 A | 9/2005 | |
| JP | 2005-336450 A | 12/2005 | |
| JP | 2006-49799 A | 2/2006 | |
| JP | 2006-286935 A | 10/2006 | |
| JP | 2007-70445 A | 3/2007 | |
| JP | 2007-91960 A | 4/2007 | |
| JP | 2007-126536 A | 5/2007 | |
| JP | 2007-511452 A | 5/2007 | |
| JP | 2007-141855 A | 6/2007 | |
| JP | WO 2007066733 A1 * | 6/2007 | C09K 11/0883 |
| WO | WO 03/079735 A1 | 9/2003 | |
| WO | WO-2005/019376 A1 | 3/2005 | |
| WO | WO-2005/052087 A1 | 6/2005 | |
| WO | WO 2005/087896 A1 * | 9/2005 | |
| WO | WO 2005087896 A1 * | 9/2005 | |
| WO | WO 2005103199 A1 * | 11/2005 | |
| WO | WO 2006/019016 A1 | 2/2006 | |
| WO | WO 2006/068141 A1 | 6/2006 | |
| WO | WO 2006/098132 A1 | 9/2006 | |
| WO | WO 2006/101095 A1 | 9/2006 | |
| WO | WO 2007/066733 A1 | 6/2007 | |
| WO | WO 2007066733 A1 * | 6/2007 | |

OTHER PUBLICATIONS

Kazuaki Ohkubo et al., "Absolute Fluorescent Quantum Efficiency of NBS Phosphor Standard Samples," Journal of the Illuminating Engineering Institute of Japan, vol. 83, No. 2, 1999, pp. 87-93.

Hirosaki et al., "Characterization and Properties of Green-Emitting β-SiAlON:Eu2+ Powder Phosphors for White Light-Emitting Diodes," Applied Physics Letters, vol. 86, No. 21, 2005, pp. 211905-1 to 211905-3.

Hirosaki et al., "Development of New Nitride Phosphors," Materials Integration, vol. 20, No. 02, 2007, pp. 17-22.

* cited by examiner

METHOD OF MANUFACTURING PHOSPHOR, LIGHT-EMITTING DEVICE, AND IMAGE DISPLAY APPARATUS

This nonprovisional application is based on Japanese Patent Applications Nos. 2007-143745 and 2007-318468 filed with the Japan Patent Office on May 30, 2007 and Dec. 10, 2007, respectively, the entire contents of which are hereby incorporated by reference.

JOINT RESEARCH AGREEMENT

National Institute for Materials Science and Sharp Kabushiki Kaisha were subject to a Joint Research Agreement at the time this invention was made and the invention was made as a result of work done under that Agreement.

FIELD OF THE INVENTION

The present invention relates to a method of manufacturing a phosphor having a β-type $Si_3N_4$ crystal structure and emitting visible light as a result of excitation with near ultraviolet or visible light. In addition, the present invention relates to a light-emitting device suitable for a backlight source of a liquid crystal display or the like, including the phosphor manufactured with the manufacturing method, as well as to an image display apparatus including the light-emitting device.

DESCRIPTION OF THE BACKGROUND ART

A phosphor is used in a vacuum-fluorescent display (VFD), a field emission display (FED) or a surface-conduction electron-emitter display (SED), a plasma display panel (PDP), a cathode-ray tube (CRT), a white light-emitting diode (LED), or the like. In any of these applications, in order to cause the phosphor to emit light, the phosphor should be supplied with energy for exciting the phosphor, so that the phosphor emits visible light by being excited by excitation light having high energy such as vacuum ultraviolet, ultraviolet, electron beams, and blue light. As a result of exposure of the phosphor to the excitation light, however, luminance of the phosphor tends to lower and deteriorate, and hence the phosphor less likely to experience lowering in luminance has been demanded. Accordingly, instead of conventional phosphors such as a silicate phosphor, a phosphate phosphor, an aluminate phosphor, and a sulfide phosphor, a sialon phosphor has been proposed as the phosphor less likely to experience lowering in luminance.

An exemplary sialon phosphor is manufactured with a manufacturing process as generally described in the following. Initially, silicon nitride ($Si_3N_4$), aluminum nitride (AlN), and europium oxide ($Eu_2O_3$) are mixed at a prescribed mol ratio, to fabricate a mixture. Then, the mixture is held in nitrogen at 1 atmosphere (0.1 MPa) at a temperature of 1700° C. for 1 hour and fired with hot pressing, to manufacture the sialon phosphor (see, for example, Japanese Patent Laying-Open No. 2002-363554 (Patent Document 1)). It has been reported that α sialon activated with Eu ions, that is obtained in this manufacturing process, serves as a phosphor emitting yellow light at 550 to 600 nm as a result of excitation with blue light at 450 to 500 nm.

In addition, a blue phosphor activated with Ce and including a JEM phase ($LaAl(Si_{6-z}Al_z)N_{10-z}Al_z$) as host crystals (see International Publication No. 2005/019376 (Patent Document 2)), a blue phosphor activated with Ce and including $La_3Si_8N_{11}O_4$ as host crystals (see Japanese Patent Laying-Open No. 2005-112922 (Patent Document 3)), and a red phosphor activated with Eu and including $CaAlSiN_3$ as host crystals (see International Publication No. 2005/052087 (Patent Document 4)) have been known.

A phosphor in which a rare-earth element has been added to β-type sialon (see Japanese Patent Laying-Open No. 60-206889 (Patent Document 5)) has been known as another sialon phosphor, and it has been shown that a phosphor activated with Tb, Yb, and Ag serves as a phosphor emitting green light at 525 nm to 545 nm. A temperature for synthesizing the phosphor described in Patent Document 5, however, is as low as 1500° C., solution of an activating element in a solid state within crystals is not sufficient, and it remains in grain boundary phase. Thus, the phosphor achieving high luminance has not been obtained.

A phosphor in which divalent Eu has been added to β-type sialon (see Japanese Patent Laying-Open No. 2005-255895 (Patent Document 6)) has been known as a sialon phosphor emitting high-luminance fluorescence, and it has been shown that this phosphor serves as a green phosphor.

Here, unlike general illumination applications, a light-emitting device serving as a white light source used as a backlight source in a liquid crystal display or the like serving as an image display apparatus desirably has a narrow emission spectral line width of three primary colors of blue, green and red. The three primary colors are obtained as a result of transmission of white light through color filters transmitting only these respective colors. Here, green emission spectrum lying between blue emission spectrum and red emission spectrum is particularly required to be narrow in the emission spectral line width and to well match with the color filter for three primary colors.

SUMMARY OF THE INVENTION

In a conventional white light source for a cold-cathode tube, a green phosphor excited by ultraviolet has been employed. Among phosphors that can be excited with a wavelength of a blue light-emitting element suitable for a white LED, however, there have been few green phosphors sufficiently narrow in the spectral line width and having a wavelength matching with the color filter of the three primary colors. The green phosphor most suitable for white light source applications has conventionally been a β-type sialon phosphor disclosed in Patent Document 6. The β-type sialon phosphor, however, is relatively wide in the emission spectrum and sharpness thereof is not necessarily satisfactory.

Under the circumstances, as a result of dedicated study of a nitride containing elements of Eu as well as Si, Al, O, and N, the present inventors have found that a substance having a specific composition region range, a specific solid solution state and a specific crystal phase can serve as a phosphor having a sharp emission peak in a wavelength range from 520 nm to 550 nm. Specifically, the present inventors have found that crystals of a solid solution including a nitride or an oxynitride having a β-type $Si_3N_4$ crystal structure as host crystals, including divalent Eu ions added as luminescent center, and having such a composition that oxygen content is not higher than 0.8 mass %, can serve as a phosphor having an emission peak wavelength in a wavelength range from 520 nm to 550 nm and having sharp emission spectrum of which full width at half maximum is not greater than 55 nm. In addition, the present inventors have found a method of synthesizing β-type sialon by nitriding simple substance silicon as an Si source, as the method of manufacturing such a phosphor. Moreover, the present inventors have found a method of lowering the oxygen content by subjecting a β-type silicon nitride raw material or a β-type sialon phosphor to heat treatment in a reduction atmosphere. Further, the present inventors have found a method of lowering the oxygen content by adding solid powders containing carbon to the β-type silicon nitride raw material and firing the mixture in a nitrogen atmosphere.

The present inventors have discovered that, among crystals of an oxynitride having a β-type $Si_3N_4$ crystal structure in which Eu or the like has been dissolved in a solid state, a phosphor having a specific composition can be employed as a phosphor emitting green fluorescence having sharp spectrum as a result of excitation with ultraviolet and visible light or electron beams or X-rays, and embodied the discovery for the first time. As a result of further dedicated study based on this embodiment, the present inventors have also succeeded in providing a first phosphor having green emission exhibiting high-luminance emission phenomenon in a specific wavelength region, a method of manufacturing the first phosphor, and a light-emitting device including the same.

From the foregoing, an object of the present invention is to solve the above-described problems, and to provide a method of manufacturing a first phosphor, of which green fluorescence emission spectrum has a narrower full width at half maximum than a conventional rare-earth-activated sialon phosphor emitting green fluorescence and of which emission spectrum shape well matches with a color filter of three primary colors of light, a light-emitting device including the first phosphor, and an image display apparatus including the light-emitting device.

The present invention relates to a light-emitting device including a semiconductor light-emitting element emitting excitation light and a first phosphor absorbing the excitation light and emitting green light, in which the first phosphor includes a solid solution of aluminum element and a metal element M selected from the group consisting of Mn, Ce and Eu in crystals of an oxynitride having a β-type $Si_3N_4$ crystal structure, an amount of oxygen in the crystals being not higher than 0.8 mass %.

In addition, in the light-emitting device according to the present invention, preferably, the first phosphor emits green light having a peak wavelength in a wavelength-range from 520 nm to 550 nm as a result of irradiation with the excitation light.

In addition, in the light-emitting device according to the present invention, preferably, the first phosphor emits green light having a peak wavelength in a wavelength range from 520 nm to 535 nm as a result of irradiation with the excitation light.

In addition, in the light-emitting device according to the present invention, preferably, metal element M is Eu and a full width at half maximum of emission spectrum of the first phosphor is 55 nm or smaller.

In addition, in the light-emitting device according to the present invention, preferably, the semiconductor light-emitting element emitting the excitation light has an emission peak wavelength from 390 nm to 480 nm.

In addition, in the light-emitting device according to the present invention, preferably, the semiconductor light-emitting element emitting the excitation light has an emission peak wavelength from 390 nm to 420 nm.

In addition, in the light-emitting device according to the present invention, preferably, the semiconductor light-emitting element emitting the excitation light has an emission peak wavelength from 400 nm to 410 nm.

In addition, in the light-emitting device according to the present invention, preferably, the semiconductor light-emitting element emitting the excitation light has an emission peak wavelength from 430 nm to 480 nm.

In addition, in the light-emitting device according to the present invention, preferably, the semiconductor light-emitting element emitting the excitation light has an emission peak wavelength from 440 nm to 450 nm.

In addition, the light-emitting device according to the present invention preferably includes a second phosphor emitting red light as a result of irradiation with the excitation light.

In addition, in the light-emitting device according to the present invention, preferably, the second phosphor emits red light having a peak wavelength in a wavelength range from 600 nm to 670 nm as a result of irradiation with the excitation light.

In addition, in the light-emitting device according to the present invention, preferably, a full width at half maximum of emission spectrum of the second phosphor is 95 nm or smaller.

In addition, in the light-emitting device according to the present invention, preferably, the second phosphor contains Eu-activated $CaAlSiN_3$.

In addition, in the light-emitting device according to the present invention, preferably, the second phosphor contains at least one of Eu-activated $M_2Si_5N_8$ (M is a metal element selected from the group consisting of Mn, Ce and Eu) and Eu-activated $Sr_2Si_5N_8$.

In addition, the light-emitting device according to the present invention preferably includes a third phosphor emitting blue light as a result of irradiation with the excitation light.

In addition, the present invention relates to an image display apparatus including the light-emitting device described above as a backlight source.

In addition, the present invention relates to an image display apparatus including the light-emitting device described above as a backlight source and color filters transmitting red light, green light and blue light respectively.

In addition, in the image display apparatus according to the present invention, preferably, a blue color filter transmitting the blue light has a transmittance at a wavelength of 530 nm, not greater than 20% of a maximum value of the transmittance.

In addition, the present invention relates to a method of manufacturing the first phosphor described above including a solid solution of aluminum element and a metal element M selected from the group consisting of Mn, Ce and Eu in crystals of an oxynitride having a β-type $Si_3N_4$ crystal structure, an amount of oxygen in the crystals being not higher than 0.8 mass %, including the step of firing a raw material mixture including a metal containing Si or an inorganic compound thereof, a metal containing Al or an inorganic compound thereof, a metal containing a metal element M (M is a metal element selected from the group consisting of Mn, Ce and Eu) or an inorganic compound thereof, and solid powders containing carbon in a nitrogen-containing atmosphere in a temperature range from at least 1200° C. to at most 2200° C.

In addition, in the method of manufacturing the first phosphor according to the present invention, preferably, the raw material mixture includes silicon nitride powders, aluminum nitride powders, europium oxide powders, and carbon powders.

In addition, the method of manufacturing the first phosphor according to the present invention preferably includes the step of forming slurry consisting of the raw material mixture and alcohol and spray drying the slurry with a spray dry apparatus.

In addition, in the method of manufacturing the first phosphor according to the present invention, preferably, the raw material mixture includes silicon nitride powders, aluminum nitride powders, and europium oxide powders, the raw material mixture is placed in a crucible made of boron nitride or carbon, and carbon powders are arranged around the crucible.

In addition, in the method of manufacturing the first phosphor according to the present invention, preferably, an amount of carbon powders in the raw material mixture is in a range from 0.1 to 10 mass %.

In addition, in the method of manufacturing the first phosphor according to the present invention, preferably, an amount of carbon powders in the raw material mixture is in a range from 0.5 to 2 mass %.

In addition, in the method of manufacturing the first phosphor according to the present invention, preferably, an average particle size of carbon powders in the raw material mixture is in a range from 0.01 to 1 µm.

In addition, in the method of manufacturing the first phosphor according to the present invention, preferably, an average particle size of carbon powders in the raw material mixture is in a range from 0.5 to 5 mm.

In addition, the method of manufacturing the first phosphor according to the present invention preferably includes the step of removing excessive carbon by heating phosphor powders to 500° C. to 800° C. in air after the firing step.

Despite exposure to stronger excitation light, luminance of the light-emitting device including the first phosphor is not lowered and the light-emitting device can be used as a long-life backlight source. By combining the light-emitting device including the first phosphor according to the present invention with the color filter transmitting light of three primary colors, a color reproduction range of a liquid crystal display apparatus can be made larger.

The first phosphor included in the light-emitting device of the present invention is mainly composed of sialon crystals that are crystals of an oxynitride having the β-type $Si_3N_4$ crystal structure, the amount of oxygen in the crystals being not higher than 0.8 mass %. Thus, the first phosphor is narrower in a width of emission peak wavelength than the conventional sialon phosphor and superior thereto as the green phosphor emitting sharp green fluorescence.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
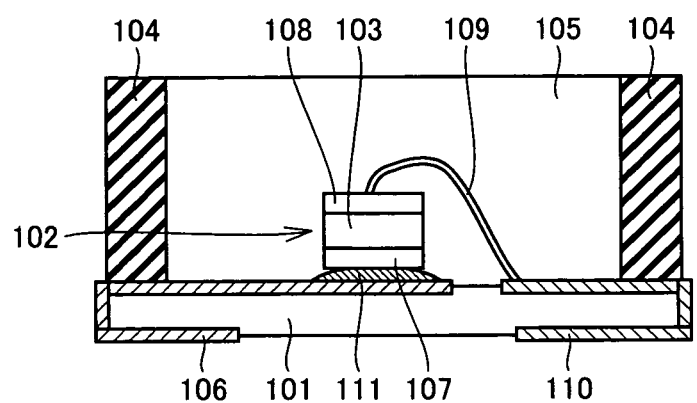
FIG. 1 is a schematic cross-sectional view of a light-emitting device according to an embodiment of the present invention.

In the drawings of the subject application, the same or corresponding elements have the same reference characters allotted. In addition, dimensional relation such as length, size, and width in the drawings is modified as appropriate for the sake of clarification and brevity of the drawings, and does not represent an actual dimension.

<First Embodiment: Light-Emitting Device>

FIG. 1 is a schematic cross-sectional view of a light-emitting device according to an embodiment of the present invention. Description will be given hereinafter with reference to FIG. 1.

In the light-emitting device shown in FIG. 1, a semiconductor light-emitting element 102 is arranged on a printed wiring board 101 serving as a base. Semiconductor light-emitting element 102 preferably includes an InGaN layer 103 as an active layer as shown in FIG. 1. In addition, inside of a resin frame 104 is filled with a mold resin 105 formed of a light-transmitting resin in which a phosphor is dispersed, to seal semiconductor light-emitting element 102. In the inside of resin frame 104, an n electrode portion 106 arranged from an upper surface to a rear surface of printed wiring board 101 and an n-side electrode 107 of semiconductor light-emitting element 102 are electrically connected to each other through a conductive adhesive 111. On the other hand, a p-side electrode 108 of semiconductor light-emitting element 102 is electrically connected to a p electrode portion 110 arranged from the upper surface to the rear surface of printed wiring board 101 through a metal wire 109. A first phosphor and a second phosphor are dispersed as the phosphor with which mold resin 105 is filled.

In the present embodiment, from a point of view of higher color purity of blue light when the light-emitting device according to the present invention is used also as the backlight source, the emission peak wavelength of semiconductor light-emitting element 102 emitting excitation light is preferably in a range from 390 nm to 550 nm, particularly preferably from 430 nm to 480 nm, and most preferably from 440 nm to 450 nm. The reason why the emission peak wavelength is particularly preferably in a range from 430 nm to 480 nm in the present embodiment is that, if the emission peak wavelength is shorter than 430 nm, a luminosity factor of a human is lower, and if the emission peak wavelength exceeds 480 nm, the color of light emission becomes blue green, that is, blue component is less. It is noted that the emission peak wavelength, a full width at half maximum of emission spectrum, and excitation spectrum can be measured not only with a known method but also with a method described later in examples.

The first phosphor in the present invention is a β-type sialon phosphor emitting green fluorescence, that is, green light, as a result of irradiation with excitation light and absorption of the excitation light, and including a solid solution of aluminum element and a metal element M (M is an element selected from the group consisting of Mn, Ce and Eu) in crystals of an oxynitride having a β-type $Si_3N_4$ crystal structure. Namely, the first phosphor is mainly composed of a solid solution of β-type sialon having the β-type $Si_3N_4$ crystal structure (hereinafter, also referred to as "β-type $Si_3N_4$ group crystal"). The β-type $Si_3N_4$ group crystal can be identified by using X-ray diffraction or neutron diffraction, and not only a substance exhibiting diffraction the same as that of pure β-type $Si_3N_4$ crystal but also a substance of which lattice constant has varied as a result of substitution of a constituent element with another element also belong to the β-type $Si_3N_4$ group crystal. In addition, depending on a manner of solution in a solid state, a point defect, a plane defect or a stacking fault may be introduced in crystals and an element dissolved in a solid state may be concentrated in such a defect portion in the grains. In such a case as well, a substance of which chart format found in X-ray diffraction is not changed also belongs to the β-type $Si_3N_4$ group crystal. Moreover, a poly-type having a long-period structure may be formed depending on periodicity of defect formation, and even in such a case, a substance having the β-type $Si_3N_4$ crystal structure as the basic structure belongs to the β-type $Si_3N_4$ group crystal.

By employing crystals of an oxynitride having the β-type $Si_3N_4$ crystal structure and dissolving metal element M (M is an element selected from the group consisting of Mn, Ce and Eu) in a solid state in the host crystals, ions of metal element M serve as luminescent center and exhibit fluorescence characteristic. Among others, a substance including a solid solution of metal element Eu in the host crystals, in which divalent Eu ions serve as the luminescent center, emits green fluorescence of high luminance.

In the first phosphor, an amount of oxygen contained in crystals of the oxynitride having the β-type $Si_3N_4$ crystal structure, that is, the content of oxygen in the crystals, is not greater than 0.8 mass %, so that a width of emission peak of the first phosphor (with the full width at half maximum serving as the reference) can be made smaller and the emission peak wavelength can be sharper. As luminescent center ion of Eu or the like representing metal element M is surrounded by oxygen ion and nitrogen ion and a bonding state is different depending on whether an atom to which metal element M is to be bonded is oxygen or nitrogen, the emission peak wavelength of the β-type $Si_3N_4$ crystals is different depending on whether metal element M is bonded to oxygen or nitrogen. It is thus believed that the width of emission peak becomes greater with the increase in the content of oxygen in the crystals of the oxynitride having the β-type $Si_3N_4$ crystal structure. Ideally, the content of oxygen is preferably as small as possible, because the peak width becomes smaller. In the present invention, however, by setting the content of oxygen to 0.8 mass % or lower and preferably to 0.5 mass % or lower, the effect thereof can be significant.

Here, the content of oxygen in the first phosphor can be measured with an inert gas fusion—infrared absorption method under JIS R 1603. In addition, the content of nitrogen in the first phosphor can be measured with an inert gas fusion—thermal conductivity method under JIS R 1603.

Here, a pure β-type $Si_3N_4$ crystal structure refers to crystals defined as a structure belonging to the hexagonal system having symmetry of $P6_3$ or $P6_3/m$ and having an ideal atom position. In actual crystals, the position of each atom is varied by about ±0.05 from the ideal position, depending on a type of atom occupying each position.

A lattice constant of the β-type $Si_3N_4$ crystal structure is set as follows: a=0.7595 nm; and c=0.29023 nm. The lattice constant, however, is varied due to substitution of a constituent element Si with an element such as Al, substitution of N with an element such as O, or solution of a metal element such as Eu in a solid state. The position of atom given based on a crystal structure, a site occupied by the atom, and coordinates of the lattice constant, however, is not considerably varied. Therefore, if only the lattice constant and Miller indices of the pure β-type $Si_3N_4$ crystal structure are given, a position (2θ) of the diffraction peak found in X-ray diffraction is uniquely determined. Then, when data of a diffraction peak position (2θ) calculated based on the lattice constant calculated from the result of X-ray diffraction measured for a new substance and the Miller indices of the pure β-type $Si_3N_4$ crystal structure matches with data of the β-type $Si_3N_4$ group crystal structure, these crystal structures can be identified as the same with each other.

In addition, the first phosphor including a solid solution of divalent Eu representing metal element M described above emits Eu-derived green fluorescence in a wavelength range from 520 nm to 550 nm as a result of irradiation with excitation light and absorption thereof. Here, the full width at half maximum of the emission spectrum of the first phosphor is not greater than 55 nm, which indicates a sharp spectrum shape. Among others, the first phosphor in which the content of oxygen in the crystals of the oxynitride having the β-type $Si_3N_4$ crystal structure is decreased to 0.5 mass % or lower exhibits emission spectrum having a peak in an emission wavelength range from 520 nm to 535 nm, and emits green fluorescence excellent in color purity. In addition, the green fluorescence takes a value of $0 \leq x \leq 0.3$ and $0.5 \leq y \leq 0.83$ at the (x, y) value on the CIE chromaticity coordinates, indicating green color excellent in color purity.

From a point of view of emission of fluorescence, desirably, the first phosphor according to the present invention includes a crystal phase of an oxynitride having the β-type $Si_3N_4$ crystal structure as the component, at high purity and as much as possible, and if possible, it is composed of single-phase crystals of the oxynitride having the β-type $Si_3N_4$ crystal structure. The first phosphor, however, may be composed of a mixture with another crystal phase or an amorphous phase so long as such a characteristic as the full width at half maximum of the emission spectrum or color purity described above is not lowered. Here, in order to attain high luminance, the content of the oxynitride having the β-type $Si_3N_4$ crystal structure is preferably not lower than 50 mass %.

The second phosphor according to the present invention preferably emits red fluorescence, that is, red light, having a peak wavelength in a wavelength range from 600 nm to 670 nm, as a result of irradiation with excitation light and absorption thereof In addition, the full width at half maximum of the emission spectrum of the second phosphor is preferably not greater than 95 nm, because color purity of red can be higher. Specifically, highly efficient red phosphors such as Eu-activated $M_2Si_5N_8$ (M is an element selected from the group consisting of Mn, Ce and Eu), Eu-activated $CaAlSiN_3$, and Eu-activated $Sr_2Si_5N_8$ can be given as examples.

The excitation light emitted from semiconductor light-emitting element 102 in the present embodiment is converted to green fluorescence by the first phosphor and to red fluorescence by the second phosphor. Then, by mixing the green fluorescence, the red fluorescence, and light emitted from semiconductor light-emitting element 102 (blue light), the light-emitting device in the present embodiment can emit white light. The light-emitting device in the present embodiment is suitable for the backlight source to be included in the image display apparatus excellent in color reproducibility.

Here, fluorescence at high luminance is emitted if light having a wavelength from 100 nm to 500 nm (vacuum ultraviolet, deep ultraviolet, ultraviolet, near ultraviolet, and visible light from violet to blue), electron beam, X-ray, or the like is employed as the phosphor excitation light emitted by semiconductor light-emitting element 102.

The form of a phosphor used in the present invention is not particularly limited, however, the phosphor is preferably formed of single crystals having an average particle size from at least 50 nm to at most 20 μm in use as powders, because high luminance is obtained. In addition, a phosphor in a spherical shape having an average aspect ratio (a value obtained by dividing a length of a major axis of a particle by a length of a minor axis) not greater than 1.5 is preferred, because handling in the step of dispersion or application is easy.

<Second Embodiment: Light-Emitting Device>

The light-emitting device according to another embodiment of the present invention will be described hereinafter with reference to FIG. 1. In the present embodiment, the first phosphor, the second phosphor, and a third phosphor are dispersed as the phosphor with which mold resin 105 is filled.

In the present embodiment, from a point of view of better color purity of blue light when the light-emitting device according to the present invention is used also as the backlight source, semiconductor light-emitting element 102 emitting the excitation light has the emission peak wavelength preferably in a range from 390 to 550 nm, particularly preferably in a range from 390 nm to 420 nm, and most preferably in a range from 400 nm to 410 nm. In the present embodiment, the reason why the emission peak wavelength is particularly preferably in a range from 390 nm to 420 nm is that, if the emission peak wavelength is shorter than 390 nm, energy as ultraviolet is high and hence deterioration of the mold resin is great, and if the wavelength exceeds 420 nm, relative luminosity factor as violet-blue light of a human is great and color purity of the blue light is lowered.

The first phosphor and the second phosphor the same as described in the first embodiment can be employed. The third phosphor in the present invention refers to a phosphor emitting blue fluorescence, that is, blue light, as a result of irradiation with excitation light and absorption thereof. Examples of the third phosphor include a phosphor composed of Ce-activated $La_3Si_8N_{11}O_4$, a phosphor composed of $BaMgAl_{10}O_{17}$:$Eu^{2+}$ (BAM), a solid solution thereof, and the like.

The excitation light emitted from semiconductor light-emitting element 102 in the present embodiment is converted to green fluorescence by the first phosphor, to red fluorescence by the second phosphor, and further to blue fluorescence by the third phosphor. Then, by mixing the green fluorescence, the red fluorescence, and the blue fluorescence, the light-emitting device in the present embodiment can emit white light. The light-emitting device in the present embodiment is suitable for the backlight source to be included in the image display apparatus excellent in color reproducibility.

In the present embodiment, as most emission of three primary colors of light is provided by the phosphor, the present embodiment is advantageous in that fluctuation in the emission peak wavelength due to environmental change such as an ambient temperature hardly takes place.

In addition, as the excitation spectrum of the excitation light absorbed by the first phosphor is higher in near ultraviolet region than in visible light region, the excitation light of semiconductor light-emitting element 102 in the present embodiment is advantageously high in emission efficiency for the first phosphor.

<Third Embodiment: Light-Emitting Device>

The light-emitting device according to another embodiment of the present invention will be described hereinafter with reference to FIG. 1. In the present embodiment, only the first phosphor is dispersed as the phosphor with which mold resin 105 is filled. Therefore, in the light-emitting device of the present embodiment, as fluorescence emitted as a result of irradiation with semiconductor light-emitting element 102 is green light, such a light-emitting device is also referred to as a green light-emitting device.

In the present embodiment, from a point of view of better color purity of blue light when the light-emitting device according to the present invention is used also as the backlight source, semiconductor light-emitting element 102 emitting the excitation light has the emission peak wavelength preferably in a range from 390 to 420 nm and most preferably in a range from 400 nm to 410 nm.

In addition, similarly, a red light-emitting device emitting red light, in which only the second phosphor is dispersed in mold resin 105 in FIG. 1, and a blue light-emitting device emitting blue light, in which only the third phosphor is dispersed, can also be fabricated.

<Fourth Embodiment: Image Display Apparatus>

Figure 2A:
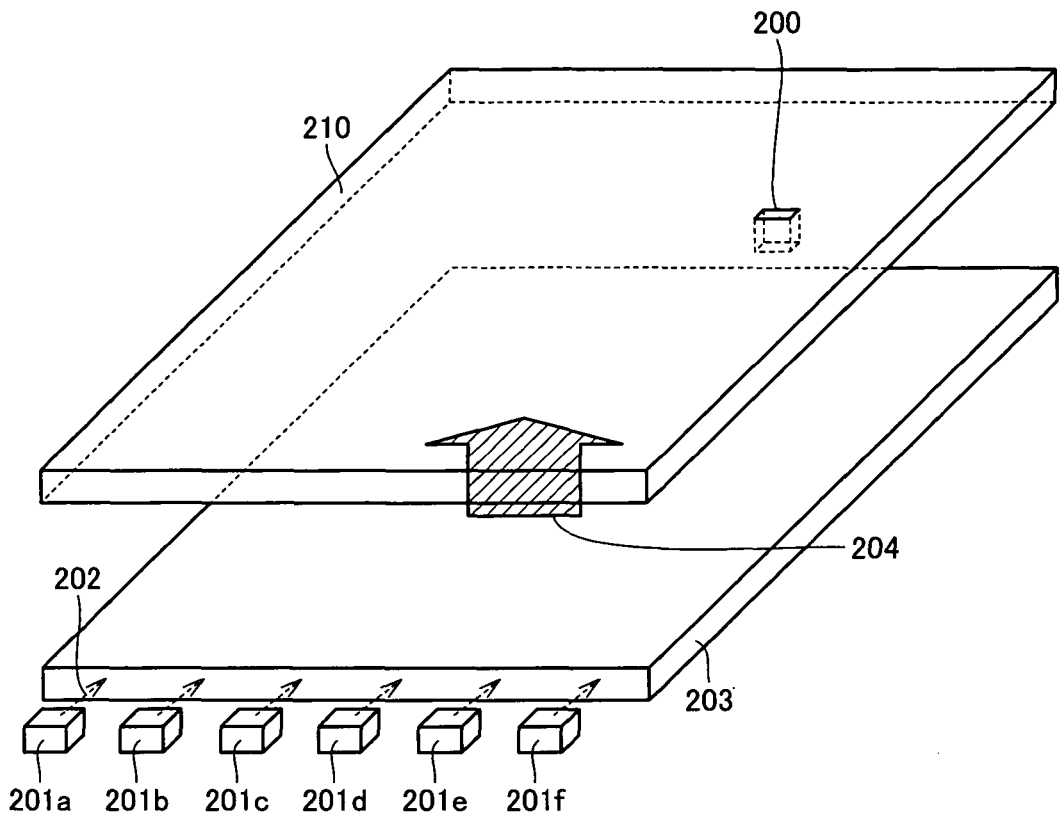
FIG. 2A is a schematic perspective view showing a structure of an image display apparatus including the light-emitting device according to the present invention.
Figure 2B:
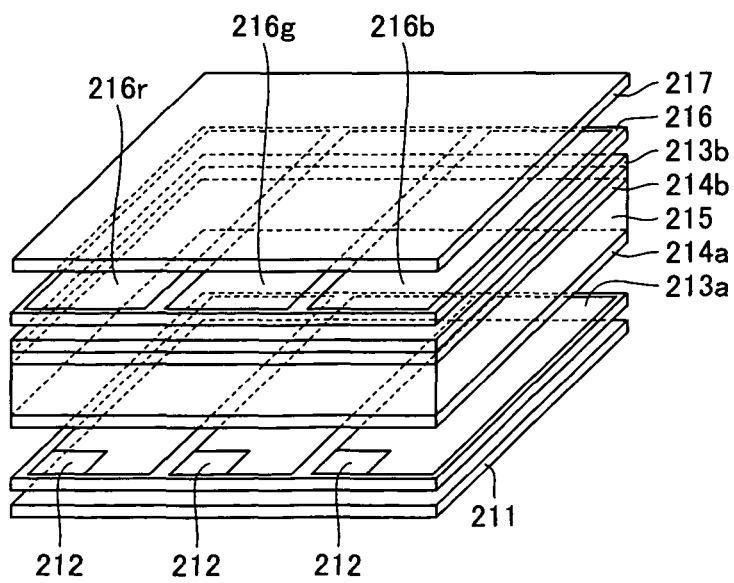
FIG. 2B is a schematic perspective view showing an enlarged view of a portion 200 in FIG. 2A.

FIG. 2A is a schematic perspective view showing a structure of an image display apparatus including the light-emitting device of the present invention. FIG. 2B is a schematic perspective view showing an enlarged view of a portion 200 in FIG. 2A. Initially, description will be given with reference to FIG. 2A. The image display apparatus according to the present invention includes light-emitting devices 201a to 201f described in the first embodiment, that are arranged on a side surface of a transparent or translucent optical guide plate 203. On optical guide plate 203, a liquid crystal display portion 210 is arranged adjacent thereto. Light 202 emitted from light-emitting devices 201a to 201f is scattered within optical guide plate 203, and the entire surface of liquid crystal display portion 210 is irradiated with that scattering light 204.

Description will now be given with reference to FIG. 2B. On a polarizing plate 211, a transparent electrode layer 213a having a thin film transistor 212, a liquid crystal layer 215 sandwiched between orientation films 214a and 214b, and an upper thin film electrode 213b are arranged. In addition, a color filter 216 for displaying a color pixel and an upper polarizing plate 217 are arranged. Color filter 216 is divided into portions having a size corresponding to each pixel in transparent electrode layer 213a, and consists of a red color filter 216r transmitting red light, a green color filter 216g transmitting green light, and a blue color filter 216b transmitting blue light.

It is noted that the term "on" or "upper" in the image display apparatus indicates a direction of thickness from light-emitting devices 201a to 201f toward upper polarizing plate 217.

Figure 3:
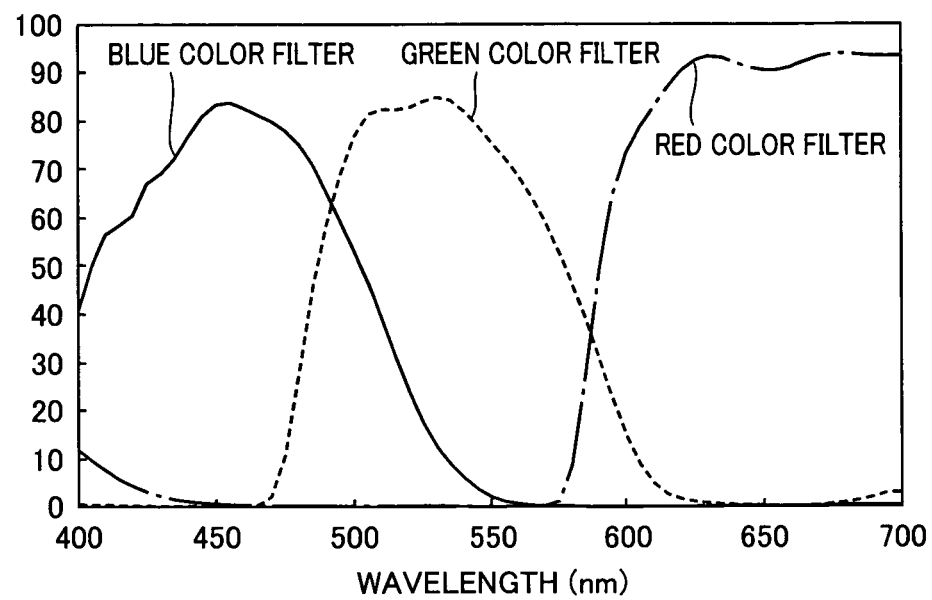
FIG. 3 shows transmittance spectrum of a preferred color filter in the image display apparatus according to the present invention.

FIG. 3 shows transmittance spectrum of a preferred color filter in the image display apparatus of the present invention. The abscissa represents a wavelength (nm) and the ordinate represents a transmittance (arbitrary unit). By combining such a color filter with light-emitting devices 201a to 201f, the image display apparatus capable of displaying three primary colors of red, blue and green can be implemented. Namely, as the emission spectra of light-emitting devices 201a to 201f exhibit sharp spectra having respective peaks in red, blue and green in the color filters described above, color purity when light is transmitted through each color filter is high. In particular, the emission peak of the green light lies between the emission peak of the blue light and the emission peak of the red light, color purity in displaying green is strongly dependent on the spectral line width of the emission peak of the green fluorescence in light-emitting devices 201a to 201f.

<Fifth Embodiment: Image Display Apparatus>

Description will be given hereinafter with reference to FIGS. 2A and 2B. The image display apparatus can be fabricated as in the fourth embodiment, except that the light-emitting device described above in the second embodiment is arranged as light-emitting devices 201a to 201f. In this case as well, the image display apparatus the same as in the fourth embodiment can be provided.

As the emission spectrum of the image display apparatus according to the present embodiment exhibits sharp spectra having respective peaks in red, blue and green in the color filters shown in FIG. 3, color purity when light is transmitted through each color filter is high. Therefore, by combining such a color filter with the light-emitting device of the present embodiment, the image display apparatus capable of displaying three primary colors of red, blue and green can be implemented.

<Sixth Embodiment: Image Display Apparatus>

Figure 4A:
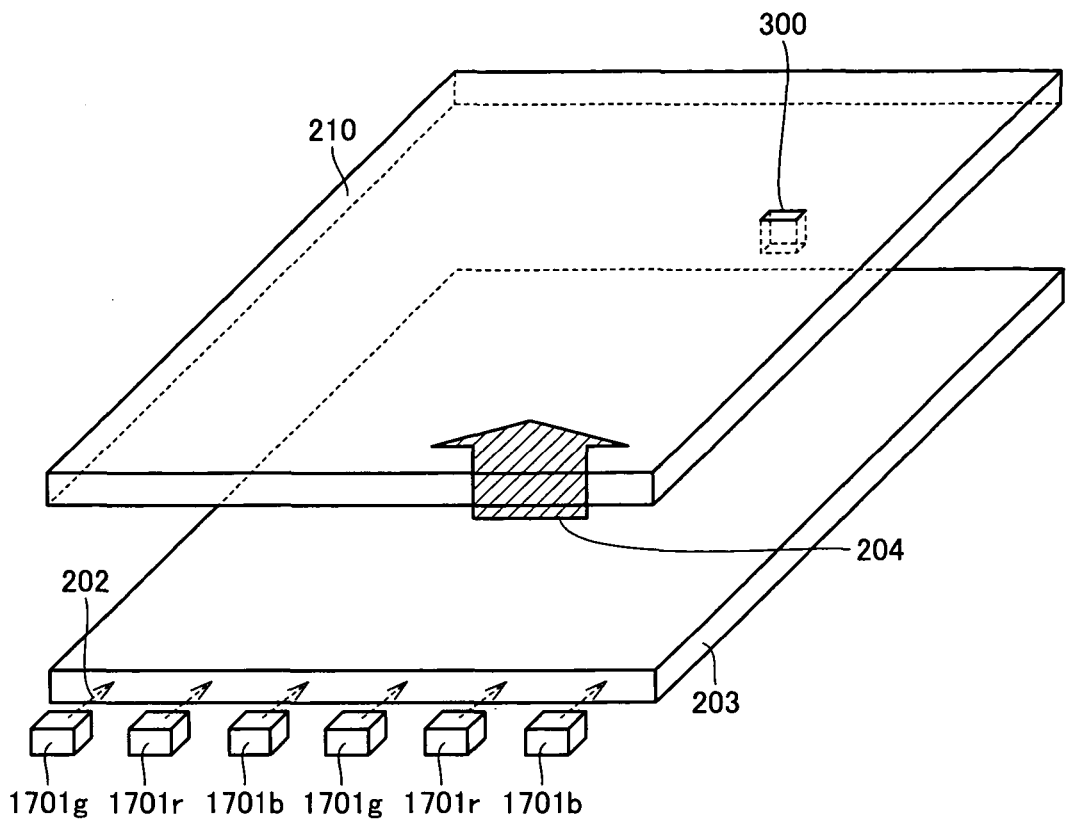
FIG. 4A is a schematic perspective view showing another structure of an image display apparatus including the light-emitting device according to the present invention.
Figure 4B:
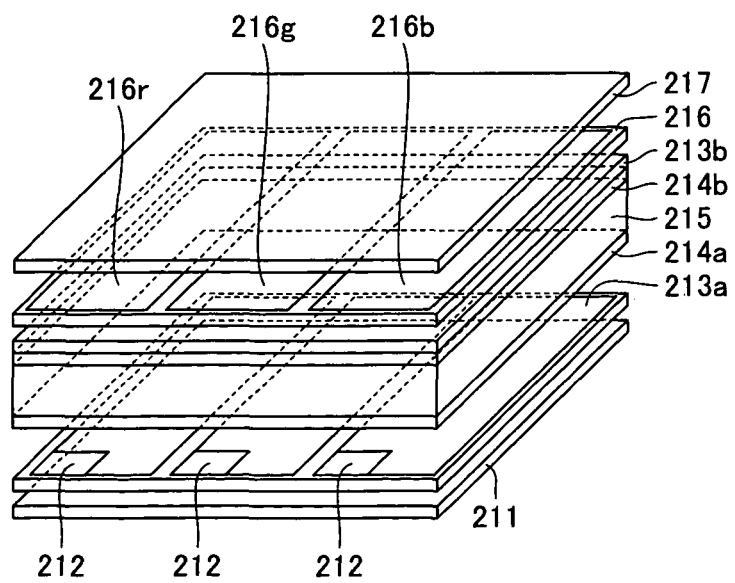
FIG. 4B is a schematic perspective view showing an enlarged view of a portion 300 in FIG. 4A.

FIG. 4A is a schematic perspective view showing another structure of the image display apparatus including the light-emitting device of the present invention. FIG. 4B is a schematic perspective view showing an enlarged view of a portion 300 in FIG. 4A. Initially, description will be given with reference to FIG. 4A.

A plurality of green light-emitting devices 1701g emitting green light, a plurality of red light-emitting devices 1701r emitting red light, and a plurality of blue light-emitting devices 1701b emitting blue light, described in the third embodiment, are arranged on the side surface of transparent or translucent optical guide plate 203. On optical guide plate 203, liquid crystal display portion 210 is arranged adjacent thereto. Light 202 emitted from the light-emitting device (semiconductor light-emitting element) described above is scattered within optical guide plate 203, and the entire surface of liquid crystal display portion 210 is irradiated with that scattering light 204.

Here, the semiconductor light-emitting element in green light-emitting device 1701g has the emission peak wavelength preferably in a range from 400 to 410 nm, and the semiconductor light-emitting element in red light-emitting device 1701r has the emission peak wavelength preferably in a range from 390 to 420 nm. A blue light-emitting device without including the third phosphor in the mold resin, having the emission peak wavelength of the semiconductor light-emitting element in a range from 430 to 480 nm, can be employed as blue light-emitting device 1701b.

Description will now be given with reference to FIG. 4B. On polarizing plate 211, transparent electrode layer 213a having thin film transistor 212, liquid crystal layer 215 sandwiched between orientation films 214a and 214b, and upper thin film electrode 213b are arranged. In addition, color filter 216 for displaying a color pixel and upper polarizing plate 217 are arranged. Color filter 216 is divided into portions having a size corresponding to each pixel in transparent electrode layer 213a, and consists of red color filter 216r transmitting red light, green color filter 216g transmitting green light, and blue color filter 216b transmitting blue light.

The image display apparatus according to the present embodiment includes light-emitting devices emitting light of red, blue and green respectively, and the emission spectra thereof exhibit sharp spectra having peaks in red, blue and green in the color filters shown in FIG. 3, respectively. Therefore, by simultaneously using the three types of light-emitting devices above, color purity when light is transmitted through each color filter is high. Therefore, by combining such a color filter with the light-emitting device of the present embodiment, the image display apparatus capable of displaying three primary colors of red, blue and green can be implemented.

<Seventh Embodiment: Image Display Apparatus>

Description will be given hereinafter with reference to FIGS. 4A and 4B. The image display apparatus of the present embodiment can be fabricated as in the sixth embodiment, except that a blue light-emitting device including the third phosphor in the mold resin and having the emission peak of the semiconductor light-emitting element in a range from 390 to 420 nm is employed as blue light-emitting device 1701b. In this case as well, the image display apparatus the same as in the sixth embodiment can be provided.

The image display apparatus according to the present embodiment includes light-emitting devices emitting light of red, blue and green respectively, and the emission spectra thereof exhibit sharp spectra having peaks in red, blue and green in the color filters shown in FIG. 3, respectively. By combining such a color filter with the light-emitting device of the present embodiment, the image display apparatus capable of displaying three primary colors of red, blue and green can be implemented.

<Eighth Embodiment: Image Display Apparatus>

Figure 5A:
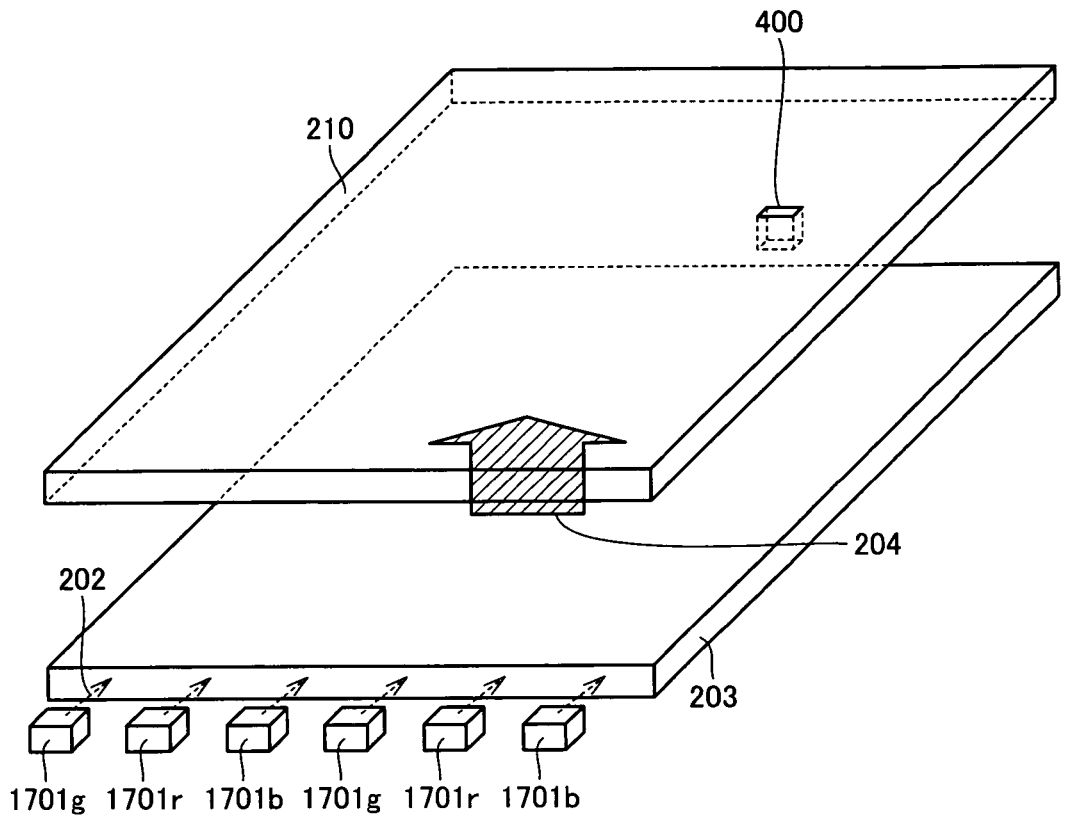
FIG. 5A is a schematic perspective view showing another structure of an image display apparatus including the light-emitting device according to the present invention.
Figure 5B:
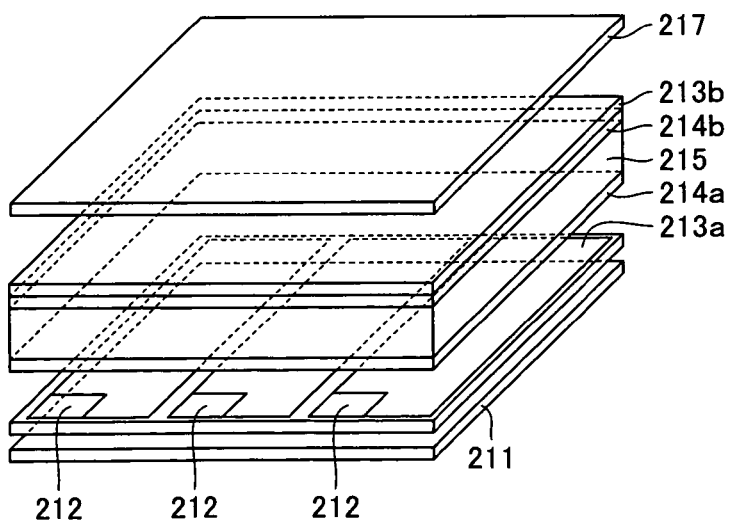
FIG. 5B is a schematic perspective view showing an enlarged view of a portion 400 in FIG. 5A.

FIG. 5A is a schematic perspective view showing another structure of the image display apparatus including the light-emitting device of the present invention. FIG. 5B is a schematic perspective view showing an enlarged view of a portion 400 in FIG. 5A. Initially, description will be given with reference to FIG. 5A.

A plurality of green light-emitting devices 1701g emitting green light, a plurality of red light-emitting devices 1701r emitting red light, and a plurality of blue light-emitting devices 1701b emitting blue light, described in the third embodiment, are arranged on the side surface of transparent or translucent optical guide plate 203. On optical guide plate 203, liquid crystal display portion 210 is arranged adjacent thereto. Light 202 emitted from the semiconductor light-emitting element described above is scattered within optical guide plate 203, and the entire surface of liquid crystal display portion 210 is irradiated with that scattering light 204.

Here, the semiconductor light-emitting element in green light-emitting device 1701g has the emission peak wavelength preferably in a range from 400 to 410 nm, and the semiconductor light-emitting element in red light-emitting device 1701r has the emission peak wavelength preferably in a range from 390 to 420 nm. A blue light-emitting device without including the third phosphor in the mold resin, having the emission peak wavelength of the semiconductor light-emitting element in a range from 430 to 480 nm, can be employed as blue light-emitting device 1701b.

Description will now be given with reference to FIG. 5B. On polarizing plate 211, transparent electrode layer 213a having thin film transistor 212, liquid crystal layer 215 sandwiched between orientation films 214a and 214b, and upper thin film electrode 213b are arranged. In the present embodiment, a color filter of three primary colors of blue, green and red is not employed. As the light-emitting devices of three primary colors of blue, green and red are independently provided, the image display apparatus drives the light-emitting devices of respective colors in a time-divided manner.

For example, each color is caused to blink at a frequency of 180 Hz and contrast is adjusted by liquid crystals. An image is displayed as a result of chronological additive color mixing.

In the present embodiment, as light-emitting devices having a narrow spectrum width are employed as the light-emitting devices of three primary colors, a color filter is not necessary and transmission loss can be decreased. In a case of drive in a time-divided manner, a response speed of the light-emitting device is required. As the conventionally used green phosphor including Tb or Mn as light-emitting ions is slow in the response speed, it is not suitable for such a drive method. The first phosphor in the present invention, however, has the response speed of several μs. Therefore, a light-emitting device and an image display apparatus suitable for such drive in a time-divided manner can be provided.

<Ninth Embodiment: Image Display Apparatus>

Description will be given hereinafter with reference to FIG. 5A. The image display apparatus can be fabricated as in the eighth embodiment, except that a blue light-emitting device including the third phosphor in the mold resin and having the emission peak wavelength of the semiconductor light-emitting element in a range from 390 to 420 nm is employed as blue light-emitting device 1701b. In this case as well, the image display apparatus the same as in the eighth embodiment can be provided.

Figure 15:
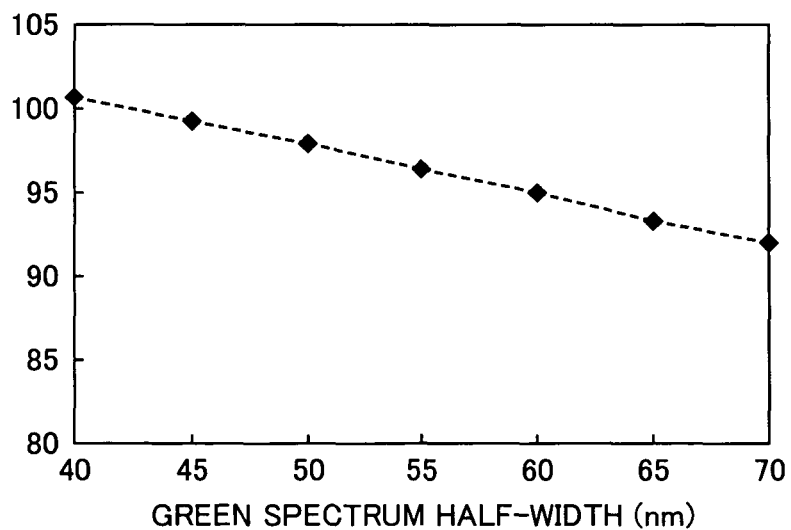
FIG. 15 is a graph showing dependency of an NTSC ratio generally used as an index indicating color reproducibility of the image display apparatus on a full width at half maximum of green light peak spectrum.

FIG. 15 shows dependency of an NTSC ratio generally used as an index indicating color reproducibility of the image display apparatus on a full width at half maximum of green light peak spectrum. The abscissa represents a full width at half maximum (nm) of green light emission spectrum and the ordinate represents an NTSC ratio as the color reproduction range. By thus making the full width at half maximum of the green spectrum smaller, the NTSC ratio can be improved, however, there has been no phosphor emitting green light that has spectrum suitable for this purpose. The first phosphor emitting green light of the present invention has the emission peak wavelength in a wavelength range from 520 nm to 550 nm and preferably in a wavelength range from 520 to 535 nm, and the first phosphor has the full width at half maximum of the emission spectrum not greater than 55 nm. Therefore, a high NTSC ratio can be achieved.

An NTSC (National Television System Committee) ratio of a conventional image display apparatus including a cold-cathode tube or a white LED is on the order of at most 80% and it has been difficult to express a natural color. In recent years, high color reproducibility has been desired with the tendency toward high-definition video images or large-screen video images. From a point of view of needs in display of video images of fine arts or cultural assets as well as in electronic commerce through the Internet, color reproducibility not lower then 95% NTSC ratio is required. The image display apparatus including the first phosphor according to the present invention (the fourth to ninth embodiments) can achieve color reproducibility not lower than 95% NTSC ratio.

The first phosphor has sharp and strong emission spectrum in the vicinity of a wavelength of 530 nm. On the other hand, as influence of emission from the green phosphor while a blue pixel is ON is less, blue color excellent in color purity can be expressed and the NTSC ratio can be high.

Here, if blue color filter 216b transmitting the blue light described above is employed, a blue color filter having a transmittance at a wavelength of 530 nm, comparable to 20% or lower of the maximum value of the transmittance is preferably employed. This is because the first phosphor described above has sharp and strong emission spectrum in the vicinity of a wavelength of 530 nm, influence of emission from the first phosphor while the blue pixel is ON is less, blue color excellent in color purity can be expressed, and the NTSC ratio can be higher.

<Method of Manufacturing First Phosphor>

The method of manufacturing the first phosphor according to the present invention is not particularly limited, however, the following method can be employed by way of example. Hereinafter, a "starting material" refers to a raw material prepared first in the manufacturing method. In addition, "raw material powders" refer to "pulverized raw material."

<<Manufacturing Method 1>>

A raw material mixture including at least metal powders containing Si, a metal containing Al or an inorganic compound thereof, and a metal containing metal element M (M is an element selected from the group consisting of Mn, Ce and Eu) or an inorganic compound thereof is fired in a nitrogen-containing atmosphere in a temperature range from at least 1200° C. to at most 2200° C., and thus a phosphor serving as the first phosphor, that includes a solid solution of M in crystals of an oxynitride having the β-type $Si_3N_4$ crystal structure, can be obtained.

Metal powders at least containing Si are used as the source of Si in the raw material mixture. Examples of metal powders containing Si are powders of an Si alloy containing another metal in addition to simple substance silicon (Si) powders. In addition to the metal powders, an inorganic substance such as silicon nitride or sialon powders can simultaneously be added as the source of Si. Addition of silicon nitride or sialon powders improves crystallinity of a product, although the content of oxygen increases, and thus luminance of the fabricated first phosphor is improved. The metal containing Al or an inorganic compound thereof is employed as the source of Al in the raw material mixture, and examples thereof are a metal Al, an Al alloy, aluminum nitride, and the like. Examples of the source of supply of metal element M (M is an element selected from the group consisting of Mn, Ce and Eu) in the raw material mixture are a metal of metal element M, an alloy, a nitride, an oxide, or a carbonate including metal element M, and the like. In order to minimize the content of oxygen in the fabricated first phosphor, a metal or a nitride of metal element M is preferably employed as the source of supply of metal element M. From a point of view of industrial availability of a raw material, however, an oxide is preferably used.

Examples of the raw material mixture in synthesizing the first phosphor containing Eu include a mixture of simple substance silicon (Si) powders, aluminum nitride powders, and europium oxide powders. A phosphor particularly low in the content of oxygen can be synthesized by using this raw material mixture.

The first phosphor is synthesized by firing the raw material mixture in the nitrogen-containing atmosphere in a temperature range from at least 1200° C. to at most 2200° C. The nitrogen-containing atmosphere refers to a nitrogen gas or a gas containing nitrogen atom in a molecule, and it may be a mixture with another gas as necessary. Examples of the gas include an $N_2$ gas, a gas mixture of $N_2$ and $H_2$, an $NH_3$ gas, a gas mixture of $NH_3$ and $CH_4$, and the like. Firing in such an atmosphere results in nitriding of simple substance silicon (Si) in the raw material into $Si_3N_4$, $Si_3N_4$ in turn reacts with the Al-containing raw material or the raw material containing metal element M, and a phosphor including a solid solution of metal element M in the crystals of the oxynitride having the β-type $Si_3N_4$ crystal structure is generated. Here, as the content of oxygen included in simple substance silicon (Si) (normally not larger than 0.5 mass %) is smaller than the content of oxygen included in the raw material mixture (normally not smaller than 1 mass %), the first phosphor low in the content of oxygen can be synthesized. It is noted that the nitrogen-containing atmosphere preferably does not substantially contain oxygen, that is, it is preferably non-oxidizing.

As nitriding reaction of Si in the raw material mixture proceeds at a temperature not lower than 1200° C. and not higher than 1550° C., the first phosphor can be synthesized in such a manner that firing in this temperature range is performed to increase the content of nitrogen in the raw material mixture and to transform Si into $Si_3N_4$, and thereafter firing at a temperature not higher than 2200° C. is performed.

<<Manufacturing Method 2>>

Another synthesis method as follows can also be employed. Raw material powders containing silicon nitride or precursor raw material mixture powders at least containing elements of Eu, Si, Al, O, and N are heated in a reduction and nitriding atmosphere, so as to decrease the content of oxygen and increase the content of nitrogen in the raw material powders containing silicon nitride or the precursor raw material mixture powders to be treated. After the content of oxygen in the starting material is thus lowered, a raw material including Eu or Al is added as necessary and firing at a temperature not higher than 2200° C. is performed. Thus, the first phosphor is synthesized.

The reduction and nitriding atmosphere refers to a gas having high reduction capability and nitriding characteristic, and examples thereof include an ammonia gas, a gas mixture of hydrogen and nitrogen, an ammonia-hydrocarbon gas mixture, and a hydrogen-nitrogen-hydrocarbon gas mixture. In addition, a methane gas or a propane gas is preferred as the hydrocarbon gas because of its high reduction capability. Alternatively, a substance obtained by adding in advance a solid containing carbon such as carbon powders or a liquid containing carbon such as phenol resin, that serves as the carbon source, to the raw material powders containing silicon nitride or the precursor raw material mixture powders may be treated with a gas having high nitriding characteristic.

<<Manufacturing Method 3>>

Yet another method is available. Specifically, oxynitride phosphor powders having the β-type $Si_3N_4$ crystal structure are heated (fired) in the reduction and nitriding atmosphere, so as to decrease the content of oxygen and increase the content of nitrogen in the oxynitride phosphor powders to be treated. This method is effective in decreasing oxygen present at the surface of a sialon phosphor synthesized with a normal method, by reducing and nitriding the oxygen.

The reduction and nitriding atmosphere refers to a gas having high reduction capability and nitriding characteristic, and examples thereof include an ammonia gas, a gas mixture of hydrogen and nitrogen, an ammonia-hydrocarbon gas mixture, and a hydrogen-nitrogen-hydrocarbon gas mixture. In addition, a methane gas or a propane gas is preferred as the hydrocarbon gas because of its high reduction capability.

<<Manufacturing Method 4: Method of Using Solid Powders Containing Carbon>>

In addition, a method of manufacturing the first phosphor including the step of firing the raw material mixture including a metal containing Si or an inorganic compound thereof, a metal containing Al or an inorganic compound thereof, a metal containing metal element M (M is a metal element selected from the group consisting of Mn, Ce and Eu) or an inorganic compound thereof, and solid powders containing carbon in a nitrogen-containing atmosphere in a temperature range from at least 1200° C. to at most 2200° C. is available.

Here, raw material powders containing powders of silicon nitride or the like can be selected as the metal containing Si or the inorganic compound thereof. Raw material powders containing powders of aluminum nitride can be selected as the metal containing Al or the inorganic, compound thereof. Raw material powders containing europium oxide can be selected as the metal containing metal element M (M is a metal element selected from the group consisting of Mn, Ce and Eu) or the inorganic compound thereof.

Addition of the solid powders containing carbon to the raw material mixture brings about reduction action of the solid powders containing carbon, and the content of oxygen in the raw material mixture is decreased. Thus, the phosphor particularly low in the content of oxygen can be synthesized.

Use of the solid powders containing carbon is advantageous as follows. As the reduction capability of the solid powders containing carbon is high, it is not necessary to use an ammonia gas, a gas mixture of hydrogen and nitrogen, an ammonia-hydrocarbon gas mixture, a hydrogen-nitrogen-hydrocarbon gas mixture, or the like as in manufacturing method 2 and manufacturing method 3, and the content of oxygen can be lowered in the nitrogen gas atmosphere.

According to manufacturing methods 1 and 2, the first phosphor is synthesized by performing heating treatment for decreasing the content of oxygen and increasing the content of nitrogen in the raw material mixture and subsequently performing firing. According to manufacturing method 3, the first phosphor is synthesized by heating the synthesized oxynitride phosphor powders having the β-type $Si_3N_4$ crystal structure in the reduction and nitriding atmosphere so as to decrease the content of oxygen and increase the content of nitrogen in the oxynitride phosphor powders to be treated. According to manufacturing method 4, firing may be performed after heating for decreasing the content of oxygen and increasing the content of nitrogen in the raw material mixture, however, as reduction capability of the solid powders containing carbon is high and decrease in the content of oxygen and increase in the content of nitrogen in the raw material mixture can be achieved in the nitrogen atmosphere, the first phosphor can be synthesized by performing firing once in the nitrogen atmosphere in a temperature range from at least 1200° C. to at most 2200° C.

In the present invention, carbon powders represent an example of the solid powders containing carbon. The carbon powders in the present invention refer to powders of which carbon content is not lower than 95%. In addition, the carbon powders preferably have an average particle size from 0.01 to 1 μm. If the particle size is smaller than 0.01 μm, the carbon powders may condense and may not uniformly be dispersed in the raw material mixture. If the particle size exceeds 1 μm, a surface area is small and desired reduction capability may not be obtained. A preferred material used as the carbon powders is "carbon black".

The raw material mixture is particularly preferably a combination of silicon nitride powders, aluminum nitride powders, europium oxide powders, and carbon powders, because these powders are highly reactive and a product of high purity can be obtained, and because these powders are produced as industrial materials and readily available.

In adding and mixing carbon powders in the raw material mixture, normally, the raw material mixture to which carbon powders have been added is mixed for 10 minutes or longer by using a mortar and a pestle made of sintered silicon nitride. Thereafter, the mixture is sieved through a 250 μm-mesh sieve, to obtain powder aggregate excellent in fluidity. Other than this method, the following method can also be employed.

Ethanol is added to the raw material mixture to which carbon powders have been added, to prepare slurry. The slurry is spray dried with a spray dry apparatus. According to this method, powder aggregate excellent in fluidity can be obtained without using a 250 μm-mesh sieve.

In addition, an amount of carbon powders in the raw material mixture is preferably in a range from 0.1 to 10 mass % and particularly preferably in a range from 0.5 to 2 mass %. If the amount of carbon powders is smaller than 0.1 mass %, desired reduction capability is not exhibited, and the content of oxygen in the first phosphor fabricated with the raw material mixture may not be decreased. On the other hand, if the amount of carbon powders exceeds 10 mass %, a large amount of carbon powders may remain in the first phosphor fabricated with the raw material mixture. If a large amount of carbon powders remains, excessive carbon is preferably removed through heating for about 2 hours in a range from 500° C. to 800° C. in air after the firing step described above. If excessive carbon is not removed, more visible light is absorbed in carbon and emission efficiency is lowered.

In addition, in the manufacturing method using the raw material mixture including the carbon powders, a temperature for firing is preferably in a range from 1200 to 2200° C. and particularly preferably in a range from 1800 to 2000° C. If the temperature for firing is lower than 1200° C., element M serving as the luminescent center is not dissolved in a solid state in the crystals of nitride or oxynitride having the β-type $Si_3N_4$ crystal structure and element M remains in the grain boundary phase where content of oxygen is high. Then, emission with an oxide glass serving as the host is produced, light of low wavelength such as blue is emitted, and light in green may not be emitted. If the temperature for firing exceeds 2200° C., a special apparatus is required, which is not industrially preferred.

Other than "carbon black", "active carbon" may be employed as a material to be used as carbon powders. In using "active carbon", a particle size thereof may be great. As the active carbon has a large internal surface area because of fine holes formed in a mesh within the carbon, satisfactory reduction capability can be achieved. Therefore, by adding the active carbon to the raw material mixture, the content of oxygen in the raw material mixture can be decreased and the first phosphor low in the content of oxygen can be synthesized. From a point of view of ease in handling, an average particle size of the active carbon to be used is preferably in a range from 0.5 mm to 5 mm. If the average particle size is smaller than 0.5 mm, it is difficult to recover the active carbon after firing. If the average particle size is larger than 5 mm, it is difficult to place the active carbon in a crucible for firing and uniform mixing tends to be difficult.

Alternatively, the first phosphor can also be manufactured by setting an atmosphere during firing to a strong reduction atmosphere using carbon, without directly adding the solid powders containing carbon to the raw material mixture.

Such a method is described as follows. The raw material mixture without including the solid powders containing carbon is placed in a crucible (small) made of boron nitride or a crucible (small) made of carbon, and the crucible (small) is in turn placed in a crucible (large) greater in volume. Then, a space around the crucible (small) filled with the raw material mixture is filled with the solid powders containing carbon. Here, "active carbon" having a particle size in a range from about 0.5 mm to 5 mm is preferably used as the solid powders containing carbon. As the active carbon has a large internal surface area because of fine holes formed in a mesh within carbon, satisfactory reduction capability can be obtained.

<<Treatment Common to Manufacturing Methods 1 to 4>>

Here, if fine powders having a particle size of several μm are employed as the starting material, the raw material mixture, the raw material powders containing silicon nitride, the precursor raw material mixture powders, or the oxynitride phosphor powders in the step of mixing fine powders form an aggregate obtained as a result of aggregation of fine powders having a particle size of several μm into a size of several hundred μm to several mm (hereinafter referred to as "powder aggregate"). By filling a container with the raw material mixture of the powder aggregate or fine powders that have not aggregated or the like while holding a fill ratio or bulk density at 40% or lower and by firing the same in the step of synthesizing the first phosphor, particularly high luminance is obtained.

Namely, normally in manufacturing a sialon phosphor, firing is performed after hot pressing or molding with a mold is performed, and firing is performed with a fill ratio of powders being high. According to the present invention, however, mechanical power is not applied to the powders or molding with a mold in advance is not performed, but a container or the like is filled with the powder aggregate uniform in particle size in natural condition, at a fill ratio or bulk density not higher than 40%. If necessary, the particle size of the powder aggregate may be controlled by using a sieve or air classification to an average particle size not larger than 500 μm. Alternatively, the powder aggregate may directly be granulated to a size not larger than 500 μm by using a spray dryer or the like. In addition, use of a container made of boron nitride is advantageous because unnecessary chemical reaction with the fabricated first phosphor is less likely.

The reason why the powder aggregate is fired with the bulk density being held at 40% or lower is to fire the powder aggregate in such a state that a free space is provided around the powder aggregate. Though depending on a form or a surface state of granular particles, an optimal bulk density is preferably set to 20% or lower. By doing so, it is believed that crystals of a reaction product grow in a free space and contact between the crystals is less, and therefore crystals having few surface defects can be synthesized. Thus, the phosphor high in luminance is obtained. If the bulk density exceeds 40%, partial close packing occurs during firing, a closely packed sintered object is produced and crystal growth is impeded, and the luminance of the first phosphor may be lowered. In addition, it is difficult to obtain the first phosphor composed of fine powders. The powder aggregate is particularly preferably not larger than 500 μm, because readiness in crushing after firing is satisfactory.

As described above, the powder aggregate of which fill ratio is not higher than 40% is fired under the above-described conditions. An electric furnace of a metal resistance heating type or of a graphite resistance heating type, including carbon as a material for a high-temperature portion of the furnace, is suitable as a furnace used for firing, because the temperature for firing is high and nitrogen is used for the atmosphere for firing. A sintering method without external application of mechanical pressure, such as a pressureless sintering method or a gas pressure sintering method, is preferred as the firing method, in order to perform firing with the bulk density being held in a prescribed range.

In the step of synthesizing the phosphor subsequent to the step of mixing fine powders described above, the nitrogen atmosphere is set to a gas atmosphere in a pressure range from at least 0.1 MPa to at most 100 MPa and more preferably in a range from at least 0.1 MPa to at most 1 MPa. If silicon nitride is used as the raw material, the nitrogen gas atmosphere lower than 0.1 MPa heated to a temperature to 1820° C. or higher is not much preferred, because the raw material is decomposed with heat. If the pressure is higher than 0.5 MPa, decomposition is hardly likely. A pressure of 1 MPa is sufficient. If the pressure is set to 100 MPa or higher, a special apparatus is required, which is not suitable for industrial production.

If the powder aggregate obtained as a result of firing is firm due to adhesion, it is crushed with an industrially normally used crusher such as a ball mill or a jet mill. Among others, if a ball mill is used for crushing, a particle size is readily controlled. A ball or a pot used here is preferably made of sintered silicon nitride or sintered sialon. Sintered ceramics having a composition the same as the first phosphor to serve as a product is particularly preferred. The powder aggregate is crushed until the average particle size thereof attains to 20 μm or smaller. Particularly preferably, the average particle size is in a range from at least 20 nm to at most 5 μm. If the average particle size exceeds 5 μm, fluidity of the first phosphor and dispersion characteristic of the same in a resin become poorer, and when the first phosphor is combined with the light-emitting element to form the light-emitting device, emission intensity becomes non-uniform from place to place. If the average particle size is smaller than 20 nm, operability of the first phosphor becomes poorer. If a target particle size is not obtained only with crushing, classification may be combined. A classification method includes screening, air classification, precipitation in a liquid, and the like.

Treatment with acid may be performed as one method of crushing and classification. In many cases, the powder aggregate obtained as a result of firing is in such a state that single crystals of nitride or oxynitride having the β-type $Si_3N_4$ crystal structure are firmly adhered to each other in a grain boundary phase mainly composed of a small amount of glass phase. Here, if the powder aggregate is immersed in an acid having a specific composition, the grain boundary phase mainly composed of the glass phase is selectively dissolved and the single crystal is isolated. Thus, each particle is obtained as a powder (particle) made of one single crystal of nitride or oxynitride having the β-type $Si_3N_4$ crystal structure, not as the powder aggregate of single crystals. As such powders are formed from single crystals having few surface defects, luminance of the phosphor is particularly high.

The fine first phosphor is obtained through the steps above, and in order to further improve luminance, it is effective to heat the first phosphor again. In this case, the powder aggregate after firing or the first phosphor of which particle size has been adjusted through crushing or classification can further be heated at a temperature not lower than 1000° C. and not higher than the temperature for firing. If the temperature is lower than 1000° C., an effect to eliminate the surface defect is low. Heat treatment at a temperature exceeding the temperature for firing is not much preferred, because the powders (particles) obtained as a result of crushing are again firmly adhered to each other. Though depending on a composition of the phosphor, an atmosphere formed of a single type or of a mixture of two or more types selected from the group consisting of nitrogen, air, ammonia, and hydrogen can be used as an atmosphere suitable for the heat treatment. A nitrogen atmosphere is preferred because it has excellent effect to eliminate a defect.

The first phosphor formed of an oxynitride, that is obtained as described above, can have an excitation range from ultraviolet to visible light wider than a normal oxide phosphor or an existing sialon phosphor. In addition, the phosphor can emit visible light, and among others, the phosphor to which Eu has been added can emit green light. In addition, the first phosphor is characterized by a narrow emission spectrum width and suitable as the backlight source of the image display apparatus. Moreover, as deterioration of the first phosphor is unlikely despite exposure to a high temperature, the first phosphor has high heat-resistance. Therefore, the first phosphor has excellent stability for a long time in an oxidizing atmosphere and in a damp environment.

The present invention will now be described further in detail with reference to examples below, however, the examples are disclosed only for facilitating understanding of the present invention, and the present invention is not limited to these examples.

EXAMPLES

In the examples below, the following measurement method was employed.

Measurement of Emission Peak Wavelength, Full Width at Half Maximum of Emission Spectrum, and Excitation Spectrum Total luminous flux emission spectrum and light absorption spectrum of a phosphor was measured using an integrating sphere (Kazuaki OHKUBO et al., "Absolute Fluorescent Quantum Efficiency of NBS Phosphor Standard Samples," Journal of the Illuminating Engineering Institute of Japan, Vol. 83, No. 2, 1999, pp. 87-93). In addition, spectrophotometer F4500 (manufactured by Hitachi, Ltd.) was used for measuring the emission peak wavelength, the full width at half maximum of the emission spectrum, and the excitation spectrum of the phosphor and the light-emitting device.

<Fabrication of First Phosphor: Where Si Powders Were Used as Starting Material>

Initially, phosphors 1 to 4 containing Si powders as the starting material, to be included in the light-emitting device of the present invention, were fabricated as the first phosphor as below.

Si powders at purity of 99.99% sieved through a 45 μm-mesh sieve (reagent grade manufactured by Kojundo Chemical Lab. Co., Ltd.), aluminum nitride powders having a specific surface area of 3.3 $m^2/g$ and oxygen content of 0.79% (F grade manufactured by Tokuyama Corp.), and europium oxide powders at purity of 99.9% (manufactured by Shin-Etsu Chemical Co., Ltd.) were used as the raw material powders for the raw material mixture.

In addition, phosphors 5 to 7 including silicon nitride powders instead of Si powders and additionally including carbon powders were fabricated as the first phosphor. The method of manufacturing phosphor 5 will be described in detail later.

The step of manufacturing a comparative phosphor 1 including silicon nitride powders instead of Si powders will also be described in detail later.

Table 1 summarizes a designed composition of phosphors 1 to 4 and comparative phosphor 1, based on an atomic ratio. Table 2 summarizes a mixing composition (mass %) of phosphors 1 to 4 and comparative phosphor 1, measured to attain the designed composition in Table 1. In order to obtain a compound having the designed composition shown in Table 1, a prescribed amount of the raw material powders was measured to attain the composition in Table 2. The raw material powders were mixed using a mortar and a pestle made of sintered silicon nitride for 10 minutes or longer and thereafter sieved through a 250 µm-mesh sieve. The powder aggregate excellent in fluidity was thus obtained. The powder aggregate was naturally dropped and placed in a crucible made of boron nitride having a diameter of 20 mm and a height of 20 mm. Thereafter, the crucible was set in an electric furnace of a graphite resistance heating type and firing was performed, to obtain a sample. In the operation for firing, initially, an atmosphere for firing was set to vacuum using a diffusion pump, and heating from a room temperature to 800° C. was conducted at a rate of 500° C. per hour. Nitrogen at purity of 99.999 volume % was introduced when the temperature attained to 800° C., and the pressure was set to 0.5 MPa. The temperature was raised to 1300° C. at a rate of 500° C. per hour and thereafter raised to 1600° C. at a rate of 1° C. per minute, and the sample was held at that temperature for 8 hours. The synthesized sample was crushed into powders using a mortar made of agate and powder X-ray diffraction measurement (XRD) using Cu Kα ray was conducted. Consequently, the obtained charts all had the β-type $Si_3N_4$ group crystal structure.

Thereafter, the powders were again heated. The powders fired at 1600° C. were crushed using a mortar and a pestle made of silicon nitride, and the powders were naturally dropped and placed in a crucible made of boron nitride having a diameter of 20 mm and a height of 20 mm. Thereafter, the crucible was set in an electric furnace of a graphite resistance heating type and firing was performed, to obtain a sample. In the operation for firing, initially, an atmosphere for firing was set to vacuum using a diffusion pump, and heating from a room temperature to 800° C. was conducted at a rate of 500° C. per hour. Nitrogen at purity of 99.999 volume % was introduced when the temperature attained to 800° C., and the pressure was set to 1.0 MPa. The temperature was raised to 1900° C. at a rate of 500° C. per hour and the sample was held at that temperature for 8 hours. The synthesized sample was crushed into powders using a mortar made of agate and powder X-ray diffraction measurement (XRD) using Cu Kα ray was conducted. Consequently, the obtained charts all had the β-type $Si_3N_4$ group crystal structure. TC-436 model nitrogen/oxygen determinator manufactured by LECO Corporation was used to measure the content of oxygen and nitrogen included in these synthesized powders. An inert gas fusion—infrared absorption method was used for measuring oxygen, while an inert gas fusion—thermal conductivity method was used for measuring nitrogen. Table 3 summarizes the content of oxygen and nitrogen in phosphors 1 to 4 and comparative phosphor 1. As shown in Table 3, the content of oxygen in phosphors 1 to 4 was not greater than 0.5 mass %.

Here, the content of oxygen shown in Table 3 is greater than a composition amount according to the designed composition (atomic ratio) in Table 1. For example, if the content of the oxygen is as shown with the designed composition of comparative phosphor 1 in Table 1, the content of oxygen (mass %) in Table 3 should be around 0.14 mass %. The reason for this may be as follows. The surfaces of Si powders and aluminum nitride powders used as the starting materials were oxidized, and a silicon oxide film and an aluminum oxide film were formed. In addition, when the raw material was crushed through the crushing step and the drying step, the surfaces of Si powders and aluminum nitride powders were oxidized and the content of oxygen increased. Moreover, oxygen or moisture at around 1 ppm is contained also in a nitrogen atmosphere gas for firing at a high temperature, and reaction of oxygen or moisture with the sample has led to increase in the content of oxygen. For these reasons, the content of oxygen shown in Table 3 is higher than the designed composition shown in Table 1.

The powders heated again were irradiated with a lamp emitting light of a wavelength of 365 nm, and it was confirmed that green light was emitted. The emission spectrum and the excitation spectrum of the powders were measured with a fluorescence spectrophotometer. Table 4 shows a peak wavelength of excitation light (in the table, denoted as "excitation wavelength"), a peak wavelength of fluorescence of the phosphor (in the table, denoted as "emission wavelength"), and a full width at half maximum of the emission spectrum. As shown in Table 4, it was found that phosphors 1 to 4 serving as the first phosphor were green phosphors having the peak wavelength of the excitation spectrum in a range from 300 to 303 nm and having the peak wavelength of the emission spectrum in a range from 524 to 527 nm. These wavelengths were shorter than that of the green phosphor having β-type sialon as the host, that had conventionally been reported, and such light is green light excellent in color purity.

FIGS. 6 to 9 show the excitation light spectra and the emission spectra of phosphors 1 to 4, respectively. As emission intensity is varied depending on a measurement apparatus or a condition, the unit thereof is arbitrary. The abscissa represents a wavelength (nm) and the ordinate represents emission intensity (arbitrary unit). As shown in FIGS. 6 to 9, phosphors 1 to 4 serving as the first phosphor were shown to have the full width at half maximum not greater than 55 nm in the emission spectrum and emit sharp green light.

Figure 16:
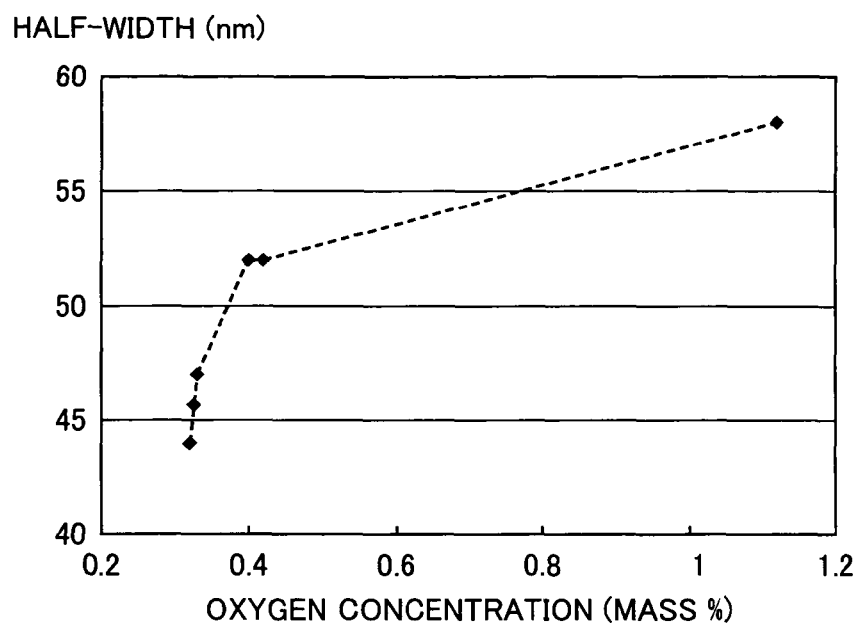
FIG. 16 is a graph showing relation between a content of oxygen and a full width at half maximum of an emission peak wavelength of the first phosphor, obtained by plotting data in Table 3 and Table 4.

FIG. 16 is a graph showing relation between the content of oxygen and the full width at half maximum of an emission peak wavelength of the first phosphor, obtained by plotting data in Table 3 and Table 4. The abscissa in FIG. 16 represents the content of oxygen (mass %) and the ordinate represents the full width at half maximum (nm). As can be seen from the relation between FIG. 15 and FIG. 16, the first phosphor according to the present invention has the content of oxygen not greater than 0.5 mass % and the full width at half maximum not greater than 55 nm, so that the first phosphor according to the present invention attained the NTSC ratio of 95% or higher. This is because the concentration of oxygen in the first phosphor in the present example is not higher than 0.8% as shown in FIG. 16.

<Fabrication of Comparative Phosphor 1>

Aluminum nitride powders having a specific surface area of 3.3 m²/g and oxygen content of 0.79% (F grade manufactured by Tokuyama Corp.), europium oxide powders at purity of 99.9% (manufactured by Shin-Etsu Chemical Co., Ltd.), and silicon nitride powders having the content of oxygen of 0.93 mass % and the content of α-type $Si_3N_4$ crystal of 92% (SN-E10 grade manufactured by Ube Industries Ltd.) were used as the raw material powders.

Initially, in order to obtain a compound having a designed composition represented as $Eu_{0.027}Si_{12.15}Al_{0.49}O_{0.04}N_{15.32}$, prescribed amounts were measure a composition of 95.82 mass % silicon nitride powders, 3.37 mass % aluminum nitride powders, and 0.81 mass % europium oxide powders, and the powders were mixed for 10 minutes or longer by using a mortar and a pestle made of sintered silicon nitride. Thereafter, the mixture was sieved through a 250 µm-mesh sieve, to obtain powder aggregate excellent in fluidity. The powder aggregate was naturally dropped and placed in a crucible made of boron nitride having a diameter of 20 mm and a height of 20 mm.

Thereafter, the crucible was set in an electric furnace of a graphite resistance heating type. An atmosphere for firing was set to vacuum using a diffusion pump, and heating from a room temperature to 800° C. was conducted at a rate of 500° C. per hour. Nitrogen at purity of 99.999 volume % was introduced when the temperature attained to 800° C., and the pressure was set to 1 MPa. The temperature was raised to 1900° C. at a rate of 500° C. per hour and the crucible was held at that temperature for 8 hours, to obtain a sample. The synthesized sample was crushed into powders using a mortar made of agate and powder X-ray diffraction measurement (XRD) using Cu Kα ray was conducted. Consequently, charts obtained from the powders all had the β-type $Si_3N_4$ group crystal structure. TC-436 model nitrogen/oxygen determinator manufactured by LECO Corporation was used to measure the content of oxygen and nitrogen included in these synthesized powders. As shown in Table 3, it was found that the content of oxygen in the powders was 1.12 mass %, that was higher than those of phosphors 1 to 4 including metal silicon (Si) as the starting material. The content of oxygen included in the silicon nitride powders was higher than metal silicon (Si) (the content of oxygen in the raw material was not larger than 0.5 mass %). Therefore, it was found that the content of oxygen was greater when the silicon nitride was used as the starting material, than when metal silicon (Si) powders were used as the starting material.

Figure 13:
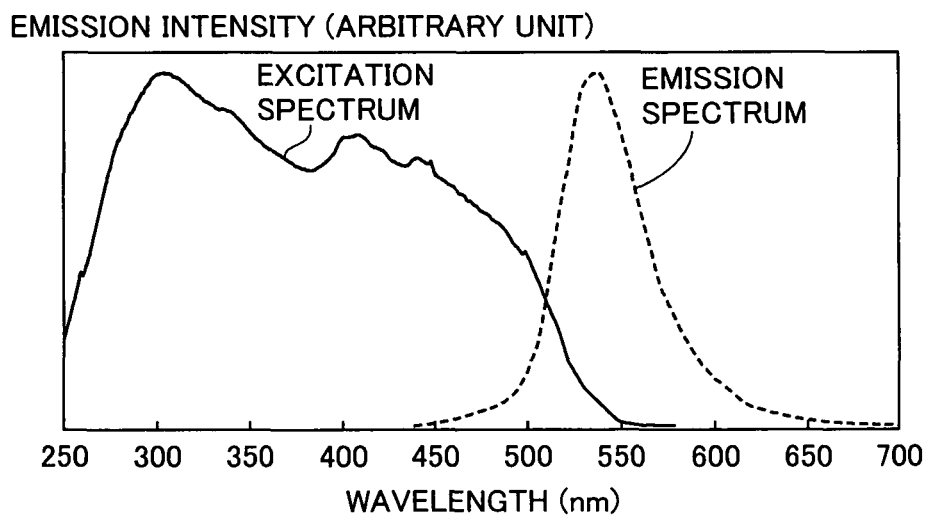
FIG. 13 shows excitation light spectrum and emission spectrum of a comparative phosphor 1.

FIG. 13 shows the excitation light spectrum and the emission spectrum of comparative phosphor 1. As to fluorescence spectrum of this material, as shown in FIG. 13, the peak wavelength of the emission spectrum was 537 nm, that was a wavelength longer than that of the phosphor having metal silicon (Si) as the starting material, and the full width at half maximum was as wide as 58 nm.

<Fabrication of First Phosphor: Where Silicon Nitride Powders Were Used as Starting Material>

Phosphors 5 to 7 including silicon nitride powders instead of Si powders as the starting material and additionally including carbon powders were fabricated as the first phosphor in the following manner. Silicon nitride powders having the content of oxygen of 0.93 mass % and the content of α-type $Si_3N_4$ crystals of 92% (SN-E10 grade manufactured by Ube Industries Ltd.), aluminum nitride powders having a specific surface area of 3.3 m²/g and oxygen content of 0.79% (F grade manufactured by Tokuyama Corp.), europium oxide powders at purity of 99.9% (manufactured by Shin-Etsu Chemical Co., Ltd.), and carbon powders (carbon black MA-600B manufactured by Mitsubishi Kasei Industries Corporation) were used as the raw material powders for the raw material mixture.

Initially, in order to obtain a compound having the designed composition shown in Table 1, prescribed amounts were measured to attain a composition of 95.82 mass % silicon nitride powders, 3.37 mass % aluminum nitride powders, and 0.81 mass % europium oxide powders, and the carbon powders were added at a ratio of 1 mass % to the total mass of the raw material mixture. The mixture was mixed using a mortar and a pestle made of sintered silicon nitride for 10 minutes or longer and thereafter sieved through a 250 µm-mesh sieve. The powder aggregate excellent in fluidity was thus obtained. This powder aggregate was employed as the raw material mixture for phosphor 5.

Thereafter, prescribed amounts were measured to attain a composition of 95.82 mass % silicon nitride powders, 3.37 mass % aluminum nitride powders, and 0.81 mass % europium oxide powders, and the carbon powders were added at a ratio of 1 mass % to the total mass of the raw material mixture. Ethanol was added to the mixture, to prepare slurry. The slurry was spray dried with a spray dry apparatus, to obtain powder aggregate. This powder aggregate was employed as the raw material mixture for phosphor 6. B-290 manufactured by Büchi was used as the spray dry apparatus.

Thereafter, prescribed amounts were measured to attain a composition of 95.82 mass % silicon nitride powders, 3.37 mass % aluminum nitride powders, and 0.81 mass % europium oxide powders. These powders were mixed using a mortar and a pestle made of sintered silicon nitride for 10 minutes or longer and thereafter sieved through a 250 µm-mesh sieve. The powder aggregate excellent in fluidity was thus obtained. This powder aggregate was employed as the raw material mixture for phosphor 7.

The powder aggregate (the raw material mixture for phosphors 5 to 7) was naturally dropped and placed in a crucible made of boron nitride having a diameter of 20 mm and a height of 20 mm.

As to phosphor 7, the crucible made of boron nitride, that contains the powder aggregate, was in turn placed in a crucible made of boron nitride greater in volume. Then, a space around the crucible made of boron nitride, that contains the powder aggregate, was filled with active carbon.

Thereafter, the crucible was set in an electric furnace of a graphite resistance heating type and firing was performed, to obtain a sample. In an operation for firing, initially, an atmosphere for firing was set to vacuum using a diffusion pump, and heating from a room temperature to 800° C. was conducted at a rate of 500° C. per hour. Nitrogen at purity of 99.999 volume % was introduced when the temperature attained to 800° C., and the pressure was set to 1 MPa. The temperature was raised to 1900° C. at a rate of 500° C. per hour and the sample was held at that temperature for 8 hours. The synthesized sample was crushed into powders using a mortar made of agate and powder X-ray diffraction measurement (XRD) using Cu Kα ray was conducted. Consequently, the obtained charts all had the β-type $Si_3N_4$ group crystal structure. TC-436 model nitrogen/oxygen determinator manufactured by LECO Corporation was used to measure the content of oxygen and nitrogen included in these synthesized powders. An inert gas fusion—infrared absorption method was used for measuring oxygen, while an inert gas fusion—thermal conductivity method was used for measuring nitrogen. Table 3 summarizes the content of oxygen and nitrogen of phosphors 5 to 7 and comparative phosphor 1. As shown in Table 3, the content of oxygen in phosphors 5 to 7 was not greater than 0.5 mass %.

The fabricated powders were irradiated with a lamp emitting light of a wavelength of 365 nm, and it was confirmed that green light was emitted. The emission spectrum and the excitation spectrum of the powders were measured with a fluorescence spectrophotometer. Table 4 shows a peak wavelength of excitation light (in the table, denoted as "excitation wavelength"), a peak wavelength of fluorescence of the phosphor (in the table, denoted as "emission wavelength"), and a full width at half maximum of the emission spectrum. As shown in Table 4, it was found that phosphors 5 to 7 serving as the first phosphor were green phosphors having the peak wavelength of the excitation spectrum in a range from 301 to 302 nm and having the peak wavelength of the emission spectrum in a range from 525 to 526 nm. These wavelengths were shorter than that of the green phosphor having β-type sialon as the host, that had conventionally been reported, and such light is green light excellent in color purity.

Figure 10:
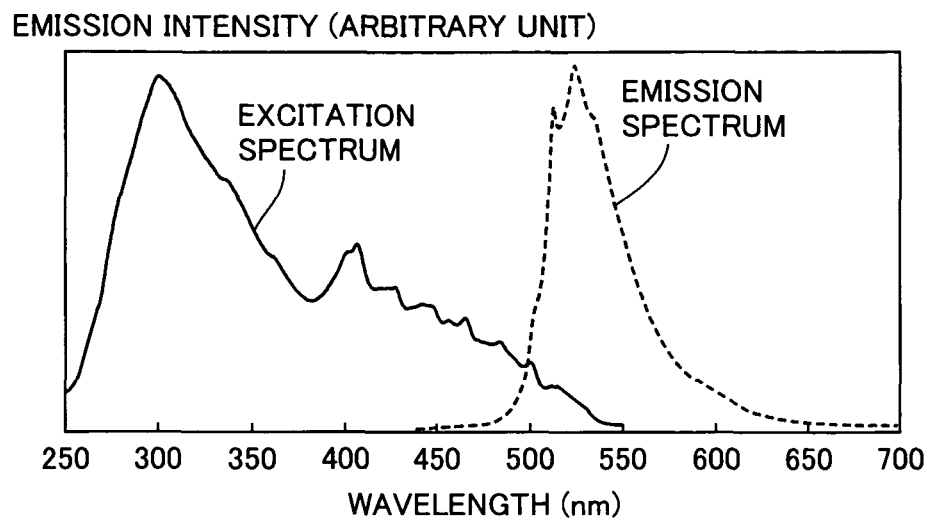
FIG. 10 shows excitation light spectrum and emission spectrum of a phosphor 5 serving as the first phosphor.
Figure 11:
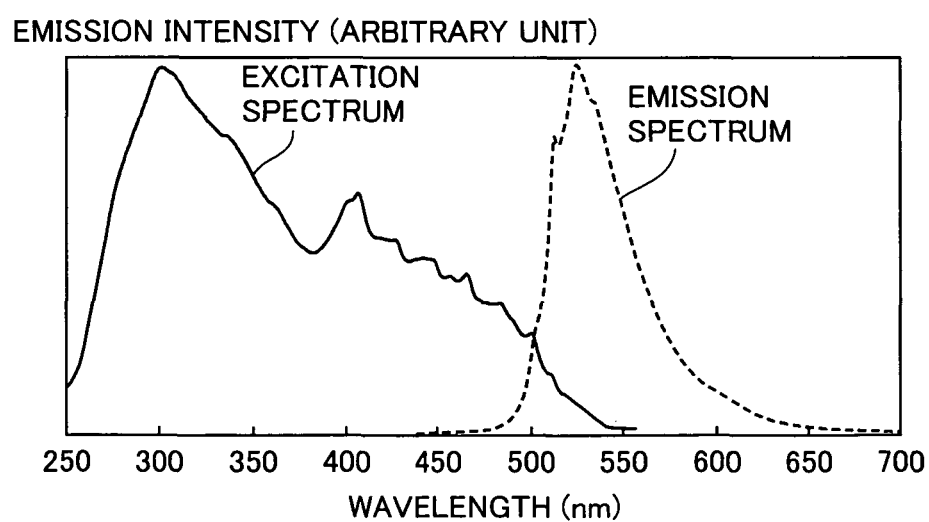
FIG. 11 shows excitation light spectrum and emission spectrum of a phosphor 6 serving as the first phosphor.
Figure 12:
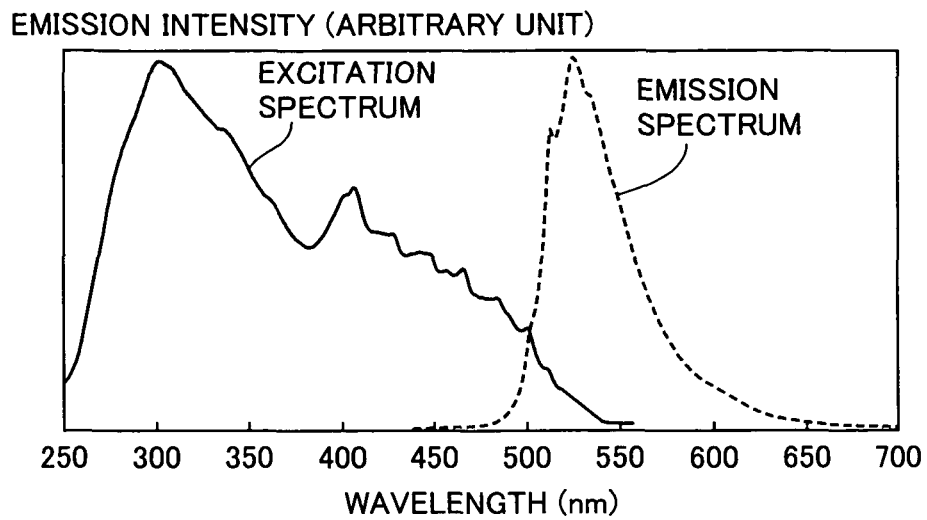
FIG. 12 shows excitation light spectrum and emission spectrum of a phosphor 7 serving as the first phosphor.

FIGS. 10 to 12 show the excitation light spectra and the emission spectra of phosphors 5 to 7, respectively. As emission intensity is varied depending on a measurement apparatus or a condition, the unit thereof is arbitrary. The abscissa represents a wavelength (nm) and the ordinate represents emission intensity (arbitrary unit). As shown in FIGS. 10 to 12, phosphors 5 to 7 serving as the first phosphor were shown to have the full width at half maximum not greater than 55 nm in the emission spectrum and emit sharp green light.

FIG. 16 is a graph showing relation between the content of oxygen and the full width at half maximum of the emission peak wavelength of the first phosphor, obtained by plotting data in Table 3 and Table 4. The abscissa in FIG. 16 represents the content of oxygen (mass %) and the ordinate represents the full width at half maximum (nm). As can be seen from the relation between FIG. 15 and FIG. 16, the first phosphor according to the present invention has the content of oxygen not greater than 0.5 mass % and the full width at half maximum not greater than 55 nm, so that the first phosphor according to the present invention attained the NTSC ratio of 95% or higher. This may be because the concentration of oxygen in the first phosphor in the present example is not higher than 0.8% as shown in FIG. 16.

Here, in order to study an amount of addition of carbon powders in the manufacturing method according to the present invention, the first phosphor was fabricated with the method the same as the "manufacturing method using silicon nitride powders as the starting material" described above, with addition of carbon in a varied amount of 0.1 mass %, 0.5 mass %, 1.0 mass %, and 2.0 mass % to the raw material mixture. The result is as shown in Table 5. Table 5 shows an amount of addition of carbon powders, the content of oxygen, the peak wavelength of fluorescence of the phosphor (in the table, denoted as "emission wavelength"), and the full width at half maximum of the emission spectrum.

As shown in Table 5, it was confirmed that the content of oxygen in the first phosphor decreased with the increase in the amount of addition of carbon powders to the raw material mixture.

It was found from Table 5 that at least 0.1 mass % carbon powders should be added in order for the concentration of oxygen in the phosphor to be 0.8% or lower.

In addition, as the content of oxygen was substantially the same when the amount of addition of carbon powders was set to 1.0 mass % and 2.0 mass %, it was found that the content of oxygen does not decrease even though the amount of addition is 1.0 mass % or greater.

Moreover, the first phosphor was fabricated with addition of carbon powders in an amount exceeding 10 mass % to the raw material mixture. Though the result is not shown in Table 5, addition of carbon powders in an amount exceeding 10 mass % resulted in remainder of a large amount of carbon powders in the fabricated first phosphor. Further, it was confirmed that the first phosphor was significantly lower in emission efficiency.

TABLE 1

| First Phosphor | Designed Composition (atomic ratio) | | | | |
| --- | --- | --- | --- | --- | --- |
| | Eu | Si | Al | O | N |
| Phosphor 1 | 0.0050 | 11.980 | 0.020 | 0.010 | 15.990 |
| Phosphor 2 | 0.0150 | 11.940 | 0.060 | 0.030 | 15.970 |
| Phosphor 3 | 0.0275 | 11.890 | 0.110 | 0.055 | 15.945 |
| Phosphor 4 | 0.0350 | 11.860 | 0.140 | 0.070 | 15.930 |
| Phosphors 5 to 7 | 0.0270 | 12.150 | 0.490 | 0.040 | 15.320 |
| Comparative Phosphor 1 | 0.0270 | 12.150 | 0.490 | 0.040 | 15.320 |

TABLE 2

| First Phosphor | Mixed Composition (atomic ratio) | | | |
| --- | --- | --- | --- | --- |
| | $Si_3N_4$ | Si | AlN | $Eu_2O_3$ |
| Phosphor 1 | | 95.199 | 4.545 | 0.257 |
| Phosphor 2 | | 94.479 | 4.755 | 0.766 |
| Phosphor 3 | | 93.590 | 5.016 | 1.393 |
| Phosphor 4 | | 93.064 | 5.170 | 1.766 |
| Phosphors 5 to 7 | 95.8200 | | 3.370 | 0.810 |
| Comparative Phosphor 1 | 95.8200 | | 3.370 | 0.810 |

TABLE 3

| First Phosphor | Oxygen/Nitrogen Content (mass %) | |
| --- | --- | --- |
| | N | O |
| Phosphor 1 | 38.8 | 0.32 |
| Phosphor 2 | 39.0 | 0.33 |
| Phosphor 3 | 39.1 | 0.40 |
| Phosphor 4 | 38.9 | 0.42 |
| Phosphor 5 | 38.7 | 0.32 |
| Phosphor 6 | 38.8 | 0.33 |
| Phosphor 7 | 38.7 | 0.33 |
| Comparative Phosphor 1 | 38.7 | 1.12 |

TABLE 4

| First Phosphor | Excitation Wavelength nm | Emission Wavelength nm | Full Width at Half Maximum nm |
| --- | --- | --- | --- |
| Phosphor 1 | 300 | 524 | 44 |
| Phosphor 2 | 301 | 525 | 47 |
| Phosphor 3 | 303 | 526 | 52 |
| Phosphor 4 | 302 | 527 | 52 |
| Phosphor 5 | 301 | 525 | 46 |
| Phosphor 6 | 302 | 526 | 47 |
| Phosphor 7 | 302 | 526 | 47 |
| Comparative Phosphor 1 | 302 | 537 | 58 |

TABLE 5

| Amount of Addition of Carbon Powders (mass %) | Oxygen Content mass % | Emission Wavelength nm | Full Width at Half Maximum nm |
| --- | --- | --- | --- |
| 0.1 | 0.74 | 535 | 55 |
| 0.5 | 0.55 | 528 | 52 |
| 1.0 | 0.31 | 525 | 46 |
| 2.0 | 0.33 | 525 | 46 |
| Comparative Phosphor 1 | 1.12 | 537 | 58 |

Example 1

Light-Emitting Device

An example of the light-emitting device according to the present invention including phosphor 1 serving as the first phosphor described above will be described hereinafter with reference to FIG. 1.

In the light-emitting device shown in FIG. 1, semiconductor light-emitting element 102 is arranged on printed wiring board 101 serving as a base. Semiconductor light-emitting element 102 includes InGaN layer 103 as an active layer. In addition, inside of resin frame 104 is filled with mold resin 105 formed of a light-transmitting resin in which a phosphor is dispersed, to seal semiconductor light-emitting element 102.

In the inside of resin frame 104, electrode portion 106 arranged from the upper surface to the rear surface of printed wiring board 101 and n-side electrode 107 of semiconductor light-emitting element 102 are electrically connected to each other through conductive adhesive 111. On the other hand, p-side electrode 108 of semiconductor light-emitting element 102 is electrically connected to electrode portion 110 arranged from the upper surface to the rear surface of printed wiring board 101 through metal wire 109. Phosphor 1 serving as the first phosphor and Eu-activated $CaAlSiN_3$ phosphor serving as the second phosphor, in which concentration of oxygen is not higher than 0.8 mass %, were used as the phosphor to be dispersed in mold resin 105.

Here, a mixing ratio in mass between the mold resin, the first phosphor, and Eu-activated $CaAlSiN_3$ phosphor was set to 50:6:1.

Figure 14:
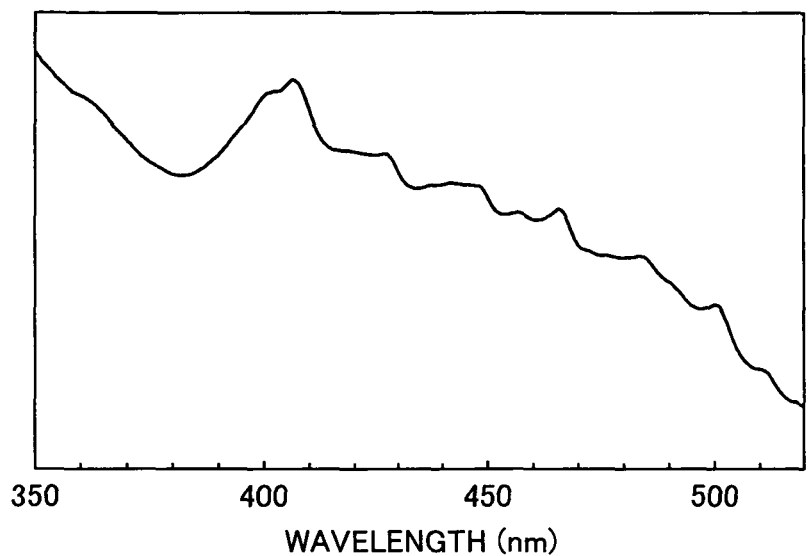
FIG. 14 shows enlarged excitation spectrum of phosphor 2 serving as the first phosphor.

FIG. 14 shows an enlarged view of the excitation spectrum of phosphor 2. Here, the emission peak wavelength of semiconductor light-emitting element 102 was set to 445 nm. The excitation spectrum of phosphors 1 to 5 exhibits a fine structure in a shape thereof, as compared with comparative phosphor 1. As shown in FIG. 14, paying attention to the excitation spectrum between 440 nm and 450 nm, a relative maximum value of the excitation spectrum is present at a point of 445 nm. Therefore, it was found that the peak wavelength of the excitation light is desirably set around this point.

Examples 2 to 5

Light-Emitting Device

In Examples 2 to 5, the light-emitting devices were fabricated as in Example 1, except that phosphors 2 to 5 were used as the first phosphors, respectively.

Figure 17:
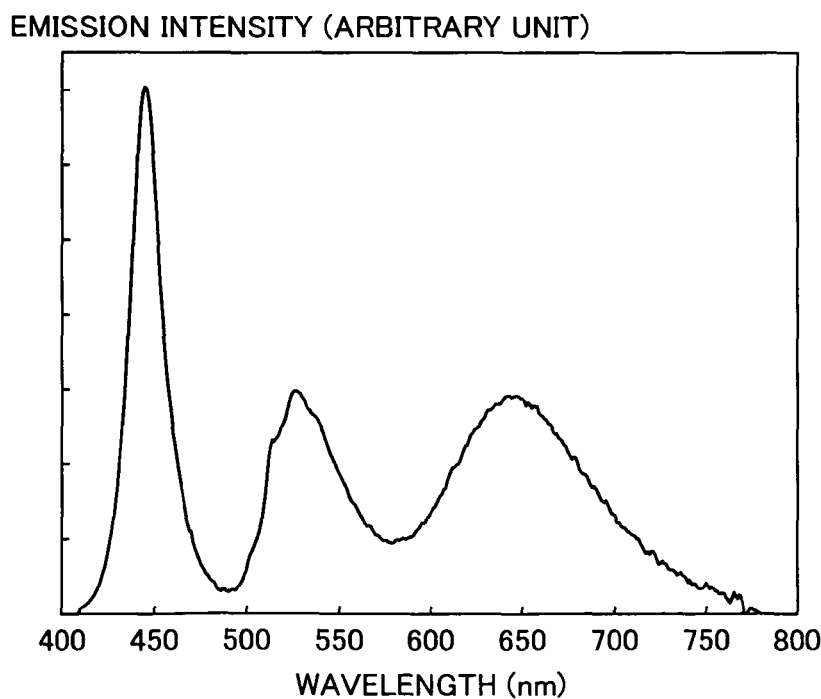
FIG. 17 shows emission spectrum emitted from the light-emitting device in Example 2.

FIG. 17 shows the emission spectrum emitted from the light-emitting device in Example 2. Here, the emission peak wavelength of semiconductor light-emitting element 102 was set to 445 nm.

As shown in FIG. 17, in addition to blue light emitted from semiconductor light-emitting element 102 and green light emitted from the first phosphor, red light was emitted from the Eu-activated $CaAlSiN_3$ phosphor serving as the first phosphor, and sharp emission of three primary colors was obtained from the light-emitting device of the present invention. This light-emitting device well matches with FIG. 3 showing transmission spectrum of the filter for the liquid crystal backlight described above, and the light-emitting device is suitable for an image processing apparatus excellent in color reproducibility. In the present example, utilizing such advantages as crystal stability in the first phosphor implemented by the oxynitride phosphor or lower dependency of emission efficiency on a temperature, stable emission spectrum can be provided in various environments. In addition, long-term reliability of the light-emitting device was also significantly higher than that of other phosphors such as an oxide phosphor.

Example 6

Light-Emitting Device

Description will be given hereinafter with reference to FIG. 1.

In addition to phosphor 2 serving as the first phosphor in which concentration of oxygen was not greater than 0.8 mass % and the Eu-activated $CaAlSiN_3$ phosphor serving as the second phosphor, a blue phosphor ($BaMgAl_{10}O_{17}:Eu^{2+}$ (BAM)) serving as the third phosphor were employed as the phosphor to be dispersed in mold resin 105.

Figure 18:
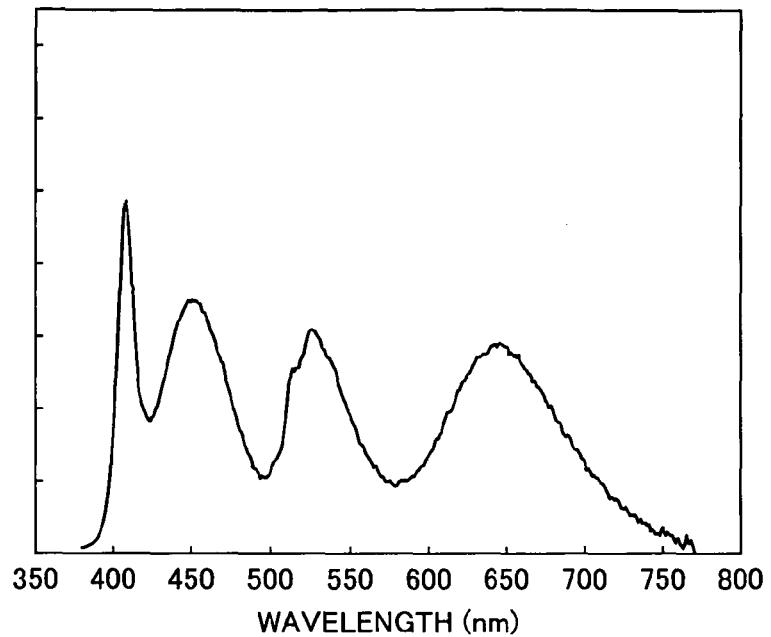
FIG. 18 shows emission spectrum emitted from the light-emitting device in Example 6.

FIG. 18 shows the emission spectrum emitted from the light-emitting device in Example 6. Here, the emission peak wavelength of semiconductor light-emitting element 102 was set to 405 nm.

Thus, the excitation light at 405 nm which is near ultraviolet emitted from semiconductor light-emitting element 102 was converted to green fluorescence by the first phosphor, to red fluorescence by the Eu-activated $CaAlSiN_3$ phosphor serving as the second phosphor, and to blue fluorescence by the third phosphor, and sharp emission in three primary colors as in FIG. 18 was obtained. It was found that this light-emitting device well matches with FIG. 3 showing transmission spectrum of the color filter described previously, and the light-emitting device is suitable for an image processing apparatus excellent in color reproducibility.

In the present example, as all light emission of three primary colors is provided by the phosphor, the present example is advantageous in that fluctuation in the emission peak wavelength due to environmental change such as am ambient temperature hardly takes place.

Figure 7:
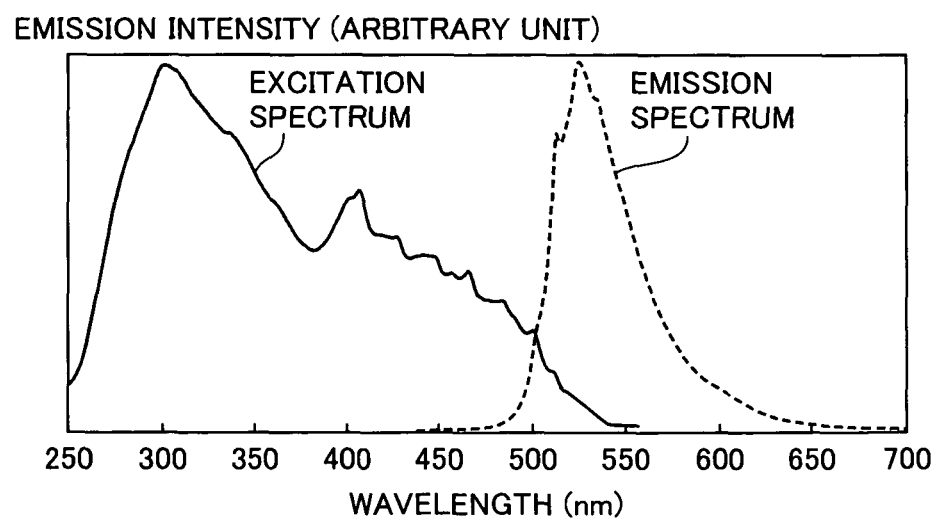
FIG. 7 shows excitation light spectrum and emission spectrum of a phosphor 2 serving as the first phosphor.
Figure 8:
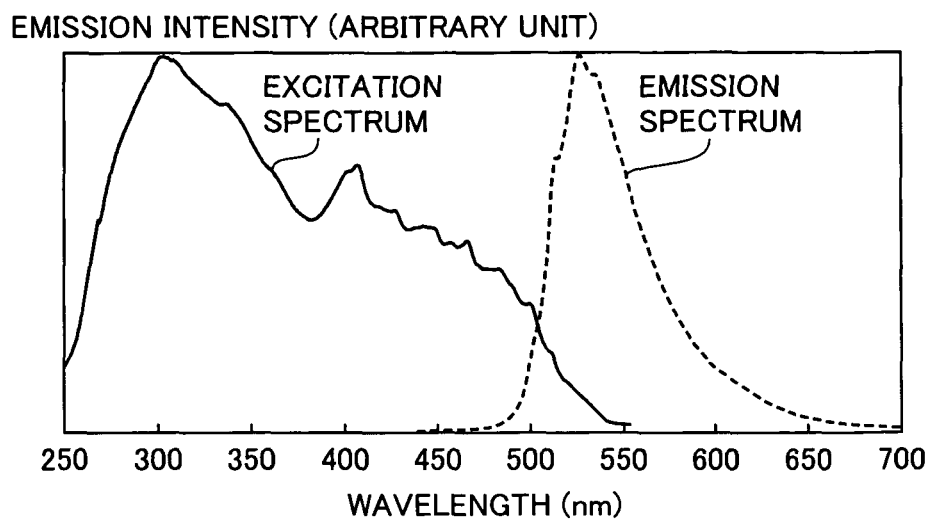
FIG. 8 shows excitation light spectrum and emission spectrum of a phosphor 3 serving as the first phosphor.
Figure 9:
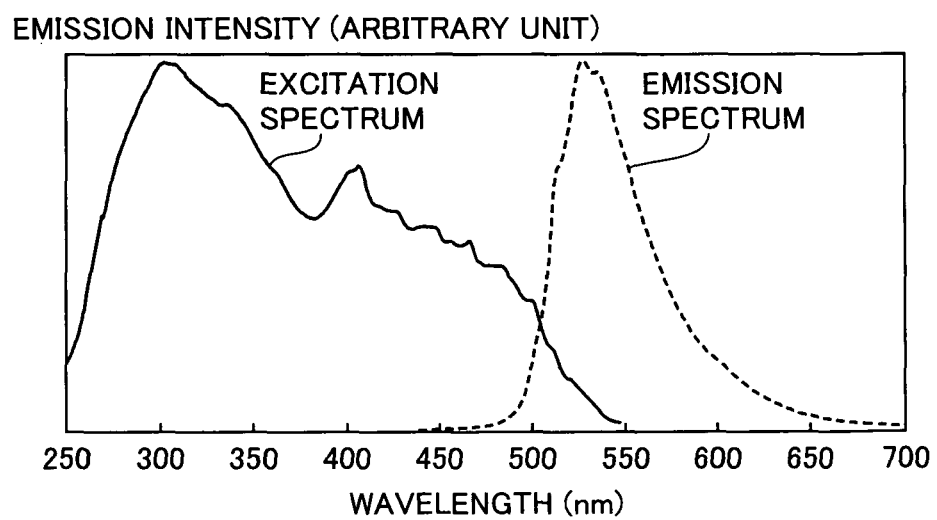
FIG. 9 shows excitation light spectrum and emission spectrum of a phosphor 4 serving as the first phosphor.

In addition, in the present example, as the excitation spectrum of phosphor 2 serving as the first phosphor is higher in the near ultraviolet region than in the visible light region as shown in FIG. 7, the emission efficiency is advantageously high.

In a case of the light-emitting device as in the present example, even if it includes any of phosphor 1 and phosphors 3 to 5 instead of phosphor 2, the excitation spectrum of the first phosphor is higher in the near ultraviolet region than in the visible light region as shown in FIGS. 6 and 8 to 10, and hence the light-emitting device is considered to be advantageously high in emission efficiency.

FIG. 14 shows an enlarged view of the excitation spectrum of phosphor 2. Here, the emission peak wavelength of semiconductor light-emitting element 102 was set to 405 nm. Looking into the excitation spectrum of the first phosphor implemented by phosphors 1 to 5 in detail, the excitation spectrum exhibits a fine structure in a shape thereof, as compared with comparative phosphor 1. As shown in FIG. 14, paying attention to the excitation spectrum between 400 nm and 410 nm, a relative maximum value of the excitation spectrum is present at a point of 405 nm. Therefore, it was found that the peak wavelength of the excitation light is desirably set around this point.

The semiconductor device in the present example was directly applicable to the image display apparatus in the present invention, and achieved high color reproduction range.

Example 7

Light-Emitting Device

Description will be given hereinafter with reference to FIG. 1.

A green light-emitting device in which only the first phosphor having concentration of oxygen described in Example 1 not greater than 0.8 mass % was dispersed in mold resin 105 and semiconductor light-emitting element 102 had the emission peak wavelength at 405 nm was fabricated as the light-emitting device. In addition, a red light-emitting device in which only the Eu-activated $CaAlSiN_3$ phosphor serving as the second phosphor was dispersed in mold resin 105 and semiconductor light-emitting element 102 had the emission peak wavelength at 405 nm was fabricated. Moreover, a blue light-emitting device in which no phosphor was dispersed in mold resin 105 and semiconductor light-emitting element 102 had the emission peak wavelength at 445 nm was fabricated as the blue light-emitting device.

Figure 19:
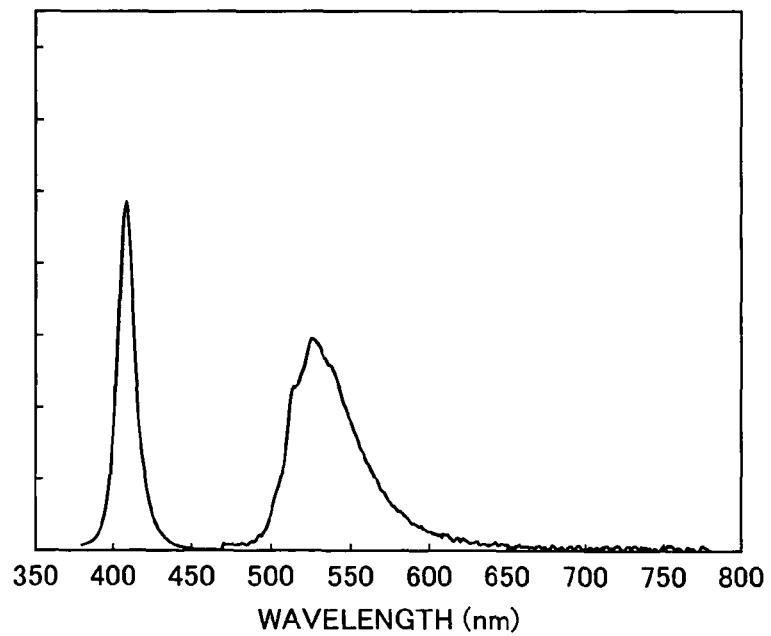
FIG. 19 shows emission spectrum emitted from a green light-emitting device in Example 7.
Figure 20:
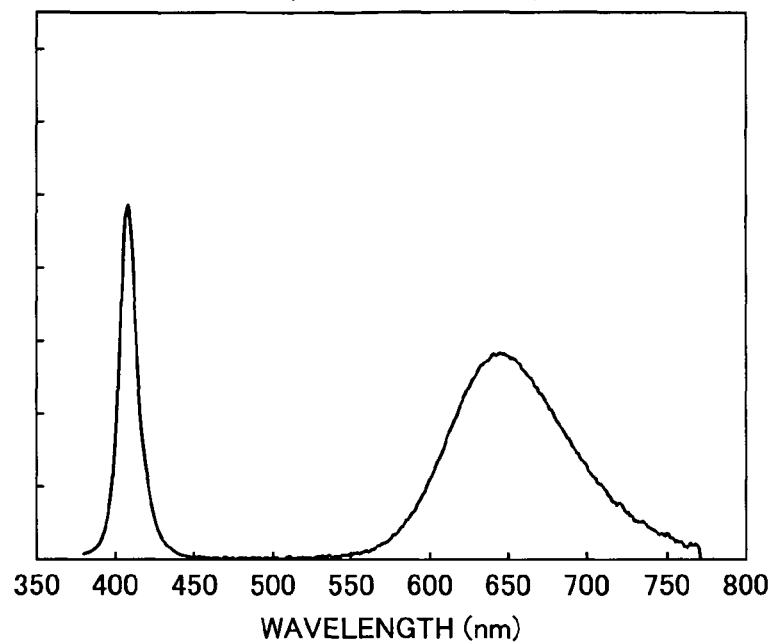
FIG. 20 shows emission spectrum emitted from a red light-emitting device in Example 7.
Figure 21:
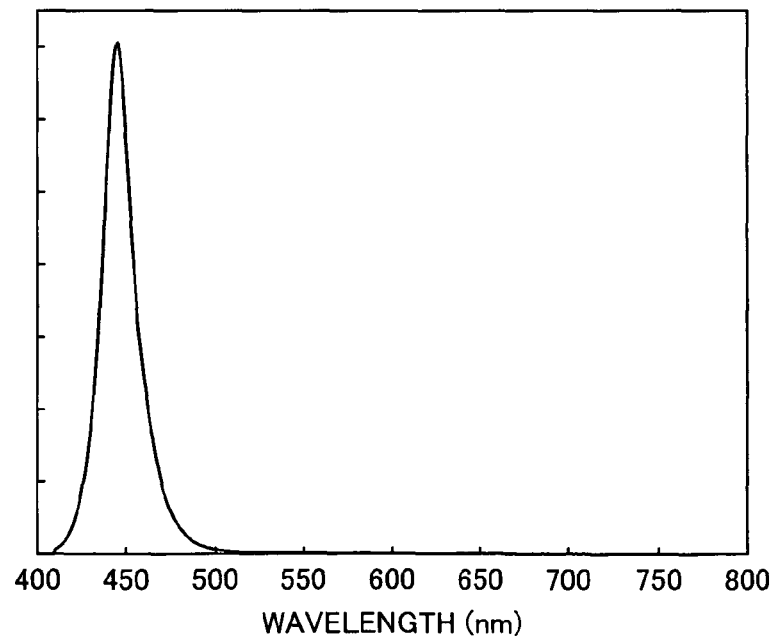
FIG. 21 shows emission spectrum emitted from a blue light-emitting device in Example 7.

FIG. 19 shows the emission spectrum emitted from the green light-emitting device, FIG. 20 shows the emission spectrum emitted from the red light-emitting device, and FIG. 21 shows the emission spectrum emitted from the blue light-emitting device. Thus, near ultraviolet emitted from semiconductor light-emitting element 102 was converted to green light by the first phosphor. The near ultraviolet emitted from semiconductor light-emitting element 102 was converted to red light by the Eu-activated $CaAlSiN_3$ phosphor. Then, together with emission from the blue light-emitting device, sharp emission of three primary colors of blue, green and red was obtained. This light-emitting device well matches with FIG. 3 showing transmission spectrum of the filter for the liquid crystal backlight described above, and the light-emitting device was suitable for an image processing apparatus excellent in color reproducibility.

Figure 6:
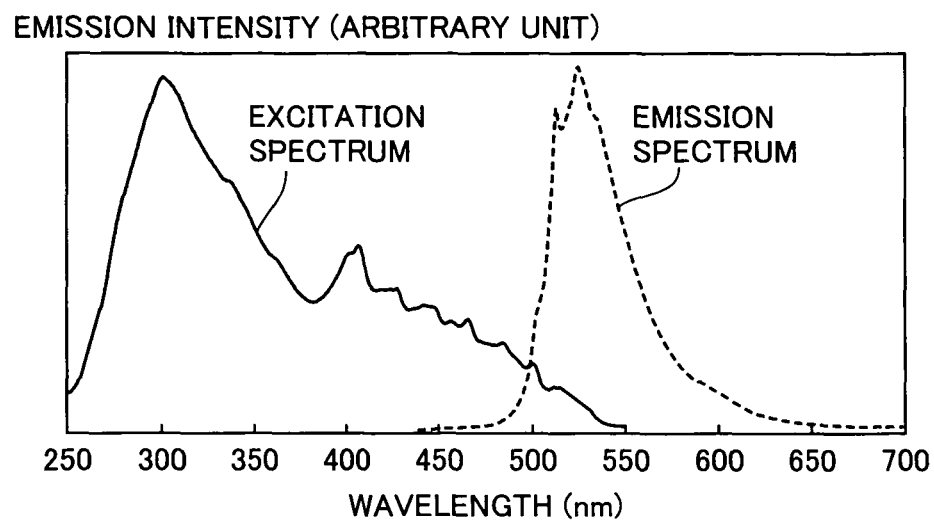
FIG. 6 shows excitation light spectrum and emission spectrum of a phosphor 1 serving as a first phosphor.

In the present example, as the excitation spectrum of phosphor 1 serving as the first phosphor used in Example 1 is higher in the near ultraviolet region than in the visible light region as shown in FIG. 6, the emission efficiency is advantageously high.

In a case of the light-emitting device as in the present example, even if it includes any of phosphors 2 to 5 instead of phosphor 1, the excitation spectrum of the first phosphor is higher in the near ultraviolet region than in the visible light region as shown in FIGS. 7 to 10, and hence the light-emitting device was considered to be advantageously high in emission efficiency.

Here, the purpose to set the emission peak wavelength of semiconductor light-emitting element 102 to 405 nm is as follows. FIG. 14 shows an enlarged view of the excitation spectrum of phosphor 2. Here, the emission peak wavelength of semiconductor light-emitting element 102 was set to 405 nm. Looking into the excitation spectrum of phosphors 1 to 5 in detail, the excitation spectrum exhibited a fine structure in a shape thereof, as compared with comparative phosphor 1. As shown in FIG. 14, paying attention to the excitation spectrum between 400 nm and 410 nm, it was found that a relative maximum value of the excitation spectrum is present at a point of 405 nm. Therefore, it was found that the peak wavelength of the excitation light is desirably set around this point.

Example 8

Image Display Apparatus

Description will be given hereinafter with reference to FIGS. 2A and 2B.

A plurality of light-emitting devices 201a to 201f shown in Example 1 were arranged on the side surface of transparent optical guide plate 203. On optical guide plate 203, liquid crystal display portion 210 was arranged adjacent thereto. Light 202 emitted from light-emitting devices 201a to 201f was scattered within optical guide plate 203, and the entire surface of liquid crystal display portion 210 was irradiated with that scattering light 204.

On polarizing plate 211, transparent electrode layer 213a having thin film transistor 212, liquid crystal layer 215 sandwiched between orientation films 214a and 214b, and upper thin film electrode 213b were arranged. In addition, color filter 216 for displaying a color pixel and upper polarizing plate 217 were arranged. Color filter 216 was divided into portions having a size corresponding to each pixel in transparent electrode layer 213a, and consisted of red color filter 216r transmitting red light, green color filter 216g transmitting green light, and blue color filter 216b transmitting blue light.

FIG. 3 shows a transmittance spectrum of a preferred color filter of the present invention. By combining such a color filter with the light-emitting device in Example 1, the image display apparatus capable of displaying three primary colors of red, blue and green could be implemented. Here, a color filter transmitting blue light, that has a transmittance at a wavelength of 530 nm, comparable to 20% or lower of the maximum value of the transmittance, was employed.

Example 9

Image Display Apparatus

Description will be given hereinafter with reference to FIGS. 4A and 4B.

A plurality of green light-emitting devices 1701g, a plurality of red light-emitting devices 1701r, and a plurality of blue light-emitting devices 1701b, described in Example 7, are arranged on the side surface of transparent optical guide plate 203. On optical guide plate 203, liquid crystal display portion 210 was arranged adjacent thereto. Light 202 emitted from the light-emitting device was scattered within optical guide plate 203, and the entire surface of liquid crystal display portion 210 was irradiated with that scattering light 204.

Description will be given hereinafter with reference to FIG. 4B. On polarizing plate 211, transparent electrode layer 213a having thin film transistor 212, liquid crystal layer 215 sandwiched between orientation films 214a and 214b, and upper thin film electrode 213b are arranged. In addition, color filter 216 for displaying a color pixel and upper polarizing plate 217 are arranged. Color filter 216 was divided into portions having a size corresponding to each pixel in transparent electrode layer 213a, and consisted of red color filter 216r transmitting red light, green color filter 216g transmitting green light, and blue color filter 216b transmitting blue light.

FIG. 3 shows a transmittance spectrum of a preferred color filter of the present invention. By combining such a color filter with the light-emitting device in Example 7, the image display apparatus capable of displaying three primary colors of red, blue and green could be implemented. Here, a blue color filter transmitting blue light, that has a transmittance at a wavelength of 530 nm, comparable to 20% or lower of the maximum value of the transmittance, was employed.

Example 10

Image Display Apparatus

Description will be given hereinafter with reference to FIG. 5A.

A plurality of green light-emitting devices 1701g, a plurality of red light-emitting devices 1701r, and a plurality of blue light-emitting devices 1701b, described in Example 7, are arranged on the side surface of transparent optical guide plate 203. On optical guide plate 203, liquid crystal display portion 210 was arranged adjacent thereto. Light 202 emitted from the light-emitting device was scattered within optical guide plate 203, and the entire surface of liquid crystal display portion 210 was irradiated with that scattering light 204.

Reference to FIG. 5B is made hereinafter. On polarizing plate 211, transparent electrode layer 213a having thin film transistor 212, liquid crystal layer 215 sandwiched between orientation films 214a and 214b, and upper thin film electrode 213b were arranged. In the present example, the color filter of three primary colors was not employed. As the light-emitting devices of three primary colors were independently provided, the present image display apparatus drove the light-emitting devices of respective colors in a time-divided manner.

For example, each color was caused to blink at a frequency of 180 Hz and contrast was adjusted by liquid crystals. It was confirmed that an image was displayed as a result of chronological additive color mixing.

The image processing apparatus in the examples above was configured such that emission from the light-emitting device enters the optical guide plate from the side surface for the sake of description, however, the similar effect can naturally be obtained by configuring the same such that the liquid crystal display portion is irradiated from a rear surface.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light-emitting device, comprising:
   a semiconductor light-emitting element emitting excitation light; and
   a first phosphor absorbing said excitation light and emitting green light having a peak wavelength in a wavelength range from 520 nm to 550 nm, wherein said first phosphor includes a solid solution of aluminum element and a metal element M selected from the group consisting of Mn, Ce, and Eu in crystals of an oxynitride having a β-type $Si_3N_4$ crystal structure, an amount of oxygen in synthesized powders of said crystals being not higher than 0.8 mass %.

2. An image display apparatus, comprising a light-emitting device as a backlight source, wherein said light-emitting device comprises
   a semiconductor light-emitting element emitting excitation light, and
   a first phosphor absorbing said excitation light and emitting green light having a peak wavelength in a wavelength range from 520 nm to 550 nm, wherein said first phosphor includes a solid solution of aluminum element and a metal element M selected from the group consisting of Mn, Ce, and Eu in crystals of an oxynitride having a β-type $Si_3N_4$ crystal structure, an amount of oxygen in synthesized powders of said crystals being not higher than 0.8 mass %.

3. The light-emitting device according to claim 1, wherein said first phosphor emits green light having a peak wavelength in a wavelength range from 520 nm to 535 nm as a result of irradiation with said excitation light.

4. The light-emitting device according to claim 1, wherein said metal element M is Eu and a full width at half maximum of emission spectrum of said first phosphor is 55 nm or smaller.

\* \* \* \* \*